(12) United States Patent
Sekigawa

(10) Patent No.: US 7,266,802 B2
(45) Date of Patent: Sep. 4, 2007

(54) DRAWING APPARATUS AND DRAWING METHOD

(75) Inventor: Kazunari Sekigawa, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 272 days.

(21) Appl. No.: 11/191,021

(22) Filed: Jul. 28, 2005

(65) Prior Publication Data

US 2006/0022982 A1 Feb. 2, 2006

(30) Foreign Application Priority Data

Jul. 29, 2004 (JP) ............................ 2004-221778
Apr. 25, 2005 (JP) ............................ 2005-126614

(51) Int. Cl.
G06F 17/50 (2006.01)
G06F 19/00 (2006.01)
G21G 5/00 (2006.01)
G21K 5/00 (2006.01)
G03C 5/00 (2006.01)

(52) U.S. Cl. ................ 716/21; 250/492.2; 250/492.22; 700/121; 430/30; 430/311

(58) Field of Classification Search ................. 716/21; 250/492.2, 492.22; 700/121; 430/30, 311, 430/324

See application file for complete search history.

(56) References Cited

U.S. PATENT DOCUMENTS

| 5,330,878 | A | * | 7/1994 | Nelson ........................ 430/311 |
| 6,074,790 | A | * | 6/2000 | Venkateswar et al. ........ 430/30 |
| 6,886,154 | B2 | * | 4/2005 | Okuyama ..................... 716/21 |
| 7,061,591 | B2 | * | 6/2006 | Bleeker et al. ................ 355/77 |
| 2003/0186164 | A1 | * | 10/2003 | Miyamoto et al. ...... 430/270.13 |
| 2003/0190536 | A1 | * | 10/2003 | Fries ............................. 430/22 |
| 2003/0224266 | A1 | * | 12/2003 | Akagawa et al. .............. 430/30 |
| 2004/0159636 | A1 | * | 8/2004 | Sandstrom et al. ....... 219/121.6 |
| 2004/0239908 | A1 | * | 12/2004 | Bleeker et al. ................ 355/67 |
| 2006/0121395 | A1 | * | 6/2006 | Fries ........................... 430/324 |

FOREIGN PATENT DOCUMENTS

JP 10-112579 4/1998

* cited by examiner

*Primary Examiner*—Stacy A Whitmore
(74) *Attorney, Agent, or Firm*—Staas & Halsey LLP

(57) ABSTRACT

A drawing apparatus, for forming a desired drawing pattern by drawing the pattern directly on a drawing target surface using a drawing engine equipped with a plurality of drawing devices arranged along a direction of relative movement of the drawing target surface, the drawing engine being designed so that the design spacing of the thus arranged drawing devices is equal to a product of a unit pixel spacing in drawing data and an integer, comprises: correcting means for generating corrected drawing data by correcting the drawing data based on the difference between the design spacing and the actual spacing of the drawing devices; and supplying means for supplying the drawing engine with the corrected drawing data just necessary for direct drawing to a drawing block that the drawing engine can draw at a time on the drawing target surface, each time the drawing target substrate moves in relative fashion by a distance corresponding to an actual pixel spacing that is obtained by dividing the actual spacing of the drawing devices by that integer.

11 Claims, 20 Drawing Sheets

Fig.4

| EXAMPLE | f [nm] | a [nm] | fx [nm] | ax [nm] | LCM (fx, ax) | LCM (fx, ax)/fx | LCM (fx, ax)/ax |
|---|---|---|---|---|---|---|---|
| 1 | 19.776 | 500.000 | 19,776 | 500,000 | 309,000,000 | 15,625 | 618 |
| 2 | 19.776 | 490.000 | 19,776 | 490,000 | 605,640,000 | 30,625 | 1,236 |
| 3 | 19.776 | 510.000 | 19,776 | 510,000 | 210,120,000 | 10,625 | 412 |

Fig.5

| s[0] | s[1] | s[2] | s[3] | s[4] | s[5] | s[6] | s[7] | s[8] | s[9] | s[10] | s[11] | s[12] | s[13] | ... | s[618] |
|---|---|---|---|---|---|---|---|---|---|---|---|---|---|---|---|
| 0 | 25 | 51 | 76 | 101 | 126 | 152 | 177 | 202 | 228 | 253 | 278 | 303 | 329 | ... | 15625 |

Fig.6

| q[0] | q[1] | q[2] | q[3] | q[4] | q[5] | q[6] | q[7] | q[8] | q[9] | q[10] | q[11] | q[12] | q[13] | ... | q[617] |
|------|------|------|------|------|------|------|------|------|------|-------|-------|-------|-------|-----|--------|
| 25   | 26   | 25   | 25   | 25   | 26   | 25   | 25   | 26   | 25   | 25    | 25    | 26    | 25    | ... | 25     |

DRAWING APPARATUS AND DRAWING METHOD

BACKGROUND OF THE INVENTION

1. Field of the Invention

The present invention relates to a drawing apparatus, and to a drawing method, for forming a desired drawing pattern by directly drawing the pattern on a drawing target surface using a drawing engine equipped with a plurality of drawing devices arranged in the direction of the relative movement of the drawing target surface, wherein the drawing engine is designed so that the design spacing of the thus arranged drawing devices is equal to an integral multiple of a unit pixel spacing in the drawing data.

2. Description of the Related Art

Generally, a wiring pattern on a wiring substrate is formed by exposing the substrate, based on wiring pattern design data, and by developing and printing the desired pattern on the substrate, followed by etching. In the exposure process, a photomask is usually used.

On the other hand, a patterning method based on direct drawing that does not use any photomasks has been proposed in recent years. According to the patterning method based on direct drawing, as corrections for the expansion, shrinkage, distortion, displacement, etc. of the substrate can be made either in advance at the drawing data generation stage or in real time, remarkable improvements can be achieved which include, for example, an improvement of the manufacturing accuracy, an improvement of the manufacturing yield, a reduction of the delivery time, and a reduction of the manufacturing cost.

Examples of the patterning method based on direct drawing include a method that forms an exposure pattern by a direct exposure process using a Digital Micromirror Device (DMD) or an electron beam exposure apparatus or the like, and a method that directly forms a wiring pattern by using an inkjet drawing apparatus equipped with an inkjet head. Among these methods, a typical example of the patterning method, based on direct exposure that uses a DMD, is disclosed in the prior art and, for example, in Japanese Unexamined Patent Publication No. 10-112579. According to the technique disclosed therein, when exposing the resist formed on a substrate, pattern data corresponding to the pattern to be exposed is generated, and this pattern data is input to the Digital Micromirror Device (DMD) to cause each of the micromirrors arranged thereon to tilt according to the pattern data, after which light is projected onto the DMD and the reflected light from the micromirrors is directed to the resist to expose it in a pattern that matches the pattern data.

FIG. 16 is a diagram schematically showing a direct drawing system. It is to be understood that, throughout the drawings given hereinafter, component elements designated by the same reference numerals are the component elements having the same functions.

The direct drawing system 100 comprises a drawing apparatus 101 and a computer 102 connected to the drawing apparatus 101. The computer 102 supplies drawing data to the drawing apparatus 101 and controls the drawing apparatus 101. The drawing apparatus 101 comprises a stage 110 on which a drawing target substrate 151 is mounted, and a drawing means 111 which moves in relative fashion over the surface of the drawing target substrate 151 in a direction indicated by an arrow in the figure. The drawing means 111 is equipped with one or more drawing engines (not shown) which are each assigned a drawing area on the surface of the drawing target substrate 151, and which perform drawing operations in parallel. A drawing engine comprises a plurality of drawing heads arranged in rows at prescribed spacing along the direction of the relative movement of the drawing target surface, and the rows of such drawing heads are arranged in a plurality of columns. Here, in the case of a maskless exposure apparatus, the drawing heads of the drawing means 111 are exposure heads for modulating light sources, and in the case of an inkjet drawing apparatus, the drawing heads are inkjet heads that eject ink.

FIG. 17 is a diagram showing the operating principle of the drawing apparatus.

The drawing means 111, which moves in relative fashion over the surface of the drawing target substrate 151, is equipped with a plurality of drawing engines #1 to #N (reference numeral 30) (N is a natural number) arranged in a direction orthogonal to the direction of the relative movement of the drawing target substrate 151. When the drawing target substrate 151 moves relative to the drawing engines #1 to #N at speed Vex, a stage controller 29 generates a signal synchronized to the relative movement (hereinafter called the "synchronizing signal") and supplies it to each of the drawing engines #1 to #N (reference numeral 30).

The drawing target substrate 151 is divided in a virtual manner into N areas called the "strips #1 to #N" (reference numeral 32). The drawing engines #1 to #N (reference numeral 30), while moving relative to the drawing target substrate 151 at speed Vex, perform drawing on their respective corresponding strips #1 to #N (reference numeral 32). Here, the length of the drawing target substrate 151 in the direction of the relative movement, that is, the length of each of the strips #1 to #N, is denoted by L (hereinafter referred to as the "strip length").

The area that each of the drawing engines #1 to #N (reference numeral 30) can draw at a time is limited, and the length of the area in the direction of the relative movement of the drawing target substrate 151 is shorter than the strip length L. Therefore, each of the strips #1 to #N (reference numeral 32) is subdivided in a virtual manner into M drawing blocks (i, j) (reference numeral 33) (here, M is a natural number, while $1 \leq i \leq N$ and $1 \leq j \leq M$). When the length of each drawing block (i, j) in the direction of the relative movement is denoted by $\Delta Y$, the relation $L = M \times \Delta Y$ holds between the strip length L and the length $\Delta Y$ of each drawing block (i, j) in the direction of the relative movement. The length of each drawing block (i, j) in the direction orthogonal to the direction of the relative movement of the drawing target substrate 151 is equal to the width of each of the strips #1 to #N (reference numeral 32).

The drawing data is typically bitmap data. As bitmap data requires a huge amount of data for storage, generating and storing the bitmap data prior to drawing would not be preferable as it would consume a large amount of memory resources. Therefore, to conserve the memory resources, for each of the drawing engines #1 to #N (reference numeral 30) the drawing data in bitmap form is generated based on design data in real time during the drawing process by dividing the data in a virtual manner for each of the drawing engines #1 to #N (reference numeral 30), that is, for each of the strips #1 to #N (reference numeral 32), and for each drawing block (i, j) in each of the strips #1 to #N (reference numeral 32); the thus generated data is first temporarily stored in memory, and then sequentially supplied to each corresponding one of the drawing engines #1 to #N (reference numeral 30). Accordingly, each of the drawing engines #1 to #N (reference numeral 30) performs the direct drawing based on the drawing data of bitmap form supplied for each drawing block (i, j). The series of these operations is performed based on the synchronizing signal that the stage controller 29 supplies as the reference signal to each of the drawing engines #1 to #N (reference numeral 30).

FIG. 18 is a flowchart showing the data processing flow in the drawing apparatus.

As shown in FIG. 18, first, the design data 51 is converted into intermediate data 52 in a first data conversion step S101. As the size of the intermediate data 52 is small compared to the size of the bitmap data to be described later, and as the first data conversion step S101 need not be performed in real time during the drawing process, the intermediate data 52 may be generated in advance and stored in memory.

In step S102, the intermediate data for one drawing block is read. Next, an alignment/correction step S103 is performed on the intermediate data thus read for one drawing block, and bitmap data 53 is generated in step S104 and temporarily stored in memory. In step S105, the generated bitmap data 53 is supplied to the corresponding drawing engine in synchronism with the synchronizing signal. In the present specification, the realtime process performed in the above steps S102 to S105 is collectively referred to as the "second data conversion process." Using the bitmap data 53 supplied for each drawing block through the second data conversion process, the drawing engine performs the direct drawing in step S106. When the drawing on the one drawing block by the drawing engine is completed, the process returns to step S102, where the second data conversion process is performed to obtain the bitmap data 53 for the next drawing block. To describe the above series of processing in another way, the drawing engine in step S106 can be regarded as "consuming" at a constant speed the bitmap data 53 supplied through the second data conversion process in synchronism with the synchronizing signal generated by the stage controller 29.

Taking a maskless exposure apparatus (direct exposure apparatus) as an example of the drawing apparatus, a brief description will be given below of the relationship between the drawing data of bitmap form and the light sources constituting the exposure head. For example, in the case of the patterning method based on direct exposure that uses the DMD as the exposure head, each micromirror corresponds to the light source.

FIG. 19 is a schematic diagram illustrating the concept of the drawing data of bitmap form used in the direct exposure process by the exposure apparatus.

The drawing data is bitmap data composed of pixels arranged in a matrix of n rows and m columns (n and m are integers) as shown schematically in FIG. 19. The coordinates of each pixel in the bitmap data are represented by g(r, c). Here, r indicates the row number in the bitmap data ($0 \leq r \leq n-1$, where r is an integer), and c indicates the column number in the bitmap data ($0 \leq c \leq m-1$, where c is an integer). The resolution, i.e., pixel spacing (hereinafter called the "unit pixel spacing"), of the bitmap data is denoted by b. It can be said that the schematic drawing of the bitmap data illustrated in FIG. 19 directly represents the exposure pattern formed (or to be formed) on the surface of the exposure target substrate (drawing target substrate) mounted on the stage (not shown).

FIG. 20 is a schematic diagram illustrating the arrangement of light sources in one drawing engine that performs the direct drawing using the drawing data shown in FIG. 19. Open circles in the figure indicate the light sources forming the exposure head.

The drawing engine that uses bitmap data such as shown in FIG. 19 usually has light sources arranged in a two-dimensional array as shown in FIG. 20.

The light sources are arranged in corresponding relationship to the bitmap data of FIG. 19; that is, m light sources per row are arranged in the column direction, and the spacing of the light sources is equal to b which is the same as the resolution (i.e., the unit pixel spacing) of the bitmap data. The column number c of the bitmap data directly corresponds to the column number c of the light source in the exposure head.

As for the light source arrangement in the row direction, the drawing head is designed so that the spacing D between the two consecutive rows is equal to p times (p is an integer) the unit pixel spacing b in the bitmap data, that is, D=pb. Here, k light sources per column are arranged in the row direction, and the row number is represented by R ($0 \leq R \leq b-1$, where R is an integer).

The exposure target substrate mounted on the stage (not shown) moves relative to the drawing engine (i.e., the light sources) at a constant speed in a prescribed direction. It can be said that the bitmap data shown in FIG. 19 also moves in a virtual manner relative to the drawing engine (i.e., the light sources) shown in FIG. 20. This virtual relative movement of the bitmap data is accomplished by supplying the necessary bitmap data to the drawing engine in synchronism with the synchronizing signal that the stage controller supplies as the reference signal.

FIGS. 21 to 24 are schematic diagrams for explaining the relationship between the bitmap data shown in FIG. 19 and the light source arrangement in the drawing engine shown in FIG. 20. As described above, the bitmap data schematically shown in each figure corresponds to the exposure pattern formed (or to be formed) on the surface of the exposure target substrate mounted on the stage (not shown). Here, consider the case where the exposure target substrate moves at speed Vex relative to the light sources R in a virtual manner in a direction indicated by an arrow in the figure. In the figure, to simplify the illustration, only some of the light sources in the third column are shown, and the other light sources are not shown.

First, as the initial condition, consider the case where the light source R=0 is aligned with the pixel g(0, 3) in the bitmap data, as shown in FIG. 21. In this condition, the synchronizing signal is sent to the drawing engine, causing the light source R=0 to emit light and thus exposing the pixel g(0, 3).

When, from the initial position, the exposure target substrate mounted on the stage moves relative to the light source by a distance corresponding to the resolution (i.e., the unit pixel spacing) b of the bitmap data (FIG. 22), the synchronizing signal is again sent to the drawing engine. At this time, the pixel g(1, 3) comes into alignment with the light source R=0, and the pixel can thus be exposed. As the light source spacing D (=pb, where p is an integer) is sufficiently larger than the resolution b of the bitmap, the pixel g(0, 3) in FIG. 22 is not aligned with any light source, and is therefore not exposed.

When the exposure target substrate mounted on the stage further moves relative to the light source by the distance b (FIG. 23), the synchronizing signal is again sent to the drawing engine. At this time, the pixel g(2, 3) comes into alignment with the light source R=0, and the pixel can thus be exposed. On the other hand, at this time, the pixels g(0, 3) and g(1, 3) are not aligned with any light source, and are therefore not exposed.

When the exposure target substrate mounted on the stage further moves relative to the light source by the distance b (FIG. 24), the synchronizing signal is again sent to the drawing engine. At this time, the pixel g(3, 3) comes into alignment with the light source R=0, while the pixel g(0, 3) comes into alignment with the light source R=1; as a result, these pixels can be exposed. On the other hand, at this time, the pixels g(1, 3) and g(2, 3) are not aligned with any light source, and are therefore not exposed.

Thereafter, each time the exposure target substrate mounted on the stage moves relative to the light source by the distance b, the synchronizing signal is sent to the drawing engine, and any pixel that comes into alignment with the light source can be exposed. For example, in the case of the pixel g(0, 3), when the exposure target substrate mounted on the stage moves in relative fashion by the distance pb from the initial position, the pixel comes into alignment with the light source R=1, and the pixel can thus be exposed one more time. In the case of the pixel g(1, 3), for example, when the exposure target substrate mounted on the stage moves in relative fashion by the distance (p+1)b from the initial position, the pixel comes into alignment with the light source R=1, and the pixel can thus be exposed one more time.

In this way, as the exposure target substrate moves in relative fashion below the drawing engine having k light sources in each column, each pixel in the bitmap data is exposed to light a total of k times. In the direct exposure apparatus, whether the intended exposure process is completed or not is determined by whether the light energy accumulated through k exposures exceeds the threshold of the photosensitive material applied on the exposure target substrate. Accordingly, if the number, k, of light sources is sufficiently large, then even if some of the k light sources fail to emit light properly due, for example, to the failure of driving transistors in the LCD or of micromirrors in the DMD in the patterning method using the DMD, the possibility that such failure will have a serious effect on the final exposure result is small. Stated another way, such redundancy in the number of light sources constitutes the basis for the reliability of the above-described exposure apparatus.

The operation of the drawing apparatus described above holds good only when the drawing engine is manufactured by strictly satisfying various design requirements. In reality, however, due to variations in hardware manufacturing, it is difficult to strictly satisfy these design requirements.

For example, in the case of the drawing data of bitmap form, as the data is generated by software on the externally connected computer, it is relatively easy to achieve the required data resolution b. On the other hand, the design condition requires that the light source spacing D in the exposure head be strictly equal to an integral multiple of (i.e., p times) the resolution (i.e., the unit pixel spacing) b of the bitmap data, but it is extremely difficult to strictly satisfy this design requirement in actual hardware because its mechanical construction is complicated. For example, when the drawing apparatus is a direct exposure apparatus, it is difficult to achieve the light source spacing as designed by finely adjusting the optics of the light sources mounted in the drawing engine. Accordingly, the light source spacing E in the exposure head actually manufactured with reference to the design (ideal) light source spacing D in the exposure head will end up being different from the design spacing D (i.e., E≠D). As a result, the value "a"(=E/p), obtained by dividing the actual spacing E by the integer p, becomes different from the unit pixel spacing b of the bitmap data (i.e., the resolution of the bitmap data). In the present specification, "a" will be referred to as the "actual pixel spacing." To summarize the above discussion, the following two relations can be obtained, where δ is the displacement.

$$\left.\begin{array}{l}|a - b| \leq \delta \\ |D - E| \leq p\delta\end{array}\right\} \quad (1)$$

If direct drawing such as described above is performed without correcting the displacement δ, that is, in the condition of a≠b, the following problem occurs. Suppose that, for a given pixel, the drawing position becomes displaced by δ from the correct position per each drawing operation. As the drawing operation is performed k times, this displacement builds up, and a displacement of the order of k×pδ at maximum can result. As a result, the intended resolution performance cannot be obtained. For example, in the case of the exposure apparatus, the exposure pattern blurs. As one drawing apparatus is usually equipped with a plurality of drawing engines, and as the displacement δ differs from one drawing engine to another, it follows that the resolution performance varies among the drawing engines.

In view of the above problem, it is an object of the present invention to provide a drawing apparatus and a drawing method that can efficiently perform stable drawing operations while maintaining a high resolution performance, as intended, when drawing a desired drawing pattern, by drawing the pattern directly on a drawing target surface using a drawing engine equipped with a plurality of drawing heads arranged along the direction of the relative movement of the drawing target surface, the drawing engine being designed so that the design spacing of the thus arranged drawing heads is equal to an integral multiple of a unit pixel spacing in drawing data.

SUMMARY OF THE INVENTION

To achieve the above object, according to the present invention, the drawing engine, which is designed so that the design spacing of the drawing devices in the drawing head is equal to a product of the unit pixel spacing in the drawing data of bitmap form (i.e., the resolution of the bitmap data) and an integer, is supplied with the drawing data "each time the drawing target surface moves in relative fashion by a distance obtained by dividing the actual spacing of the drawing devices in the drawing head by that integer", not "each time the drawing target surface moves in relative fashion by a distance corresponding to the unit pixel spacing."

The reason that the above displacement (error) occurs and the displacement builds up is that, each time the drawing target surface moves in relative fashion by a distance corresponding to the resolution b of the bitmap data, the bitmap data of the resolution b is supplied to the drawing engine and the data is "consumed", despite the fact that the drawing devices in the drawing head, whose design spacing is set to D(=pb), are actually arranged at the spacing E(=pa) which is different from the design spacing D. In view of this, in the present invention, the bitmap data of the resolution b is supplied to the drawing engine each time the drawing target surface moves in relative fashion by the distance "a"(≠b) obtained by dividing the actual spacing E of the drawing devices in the drawing head by the integer p. In this way, by correcting the data supply timing by accounting for the actual spacing of the drawing devices in the drawing head, the problem of the displacement and displacement buildup can be resolved. Hereinafter, the distance "a" obtained by dividing the actual spacing E of the drawing devices in the drawing head by the integer p will be referred to as the "actual pixel spacing."

On the other hand, when supplying the drawing data to the drawing engine each time the drawing target surface moves in relative fashion by the distance corresponding to the actual pixel spacing "a"(≠b), as described above, if the direct drawing is performed without applying any corrections to the drawing data, the drawing pattern formed on the substrate will be different from the intended one. This will be explained in detail below by taking as an example the case where the resolution b=500 nm and the displacement δ=10 nm, that is, "a" is 490 nm and 510 nm, respectively.

First, when "a"=490 nm, as the bitmap data of resolution b=500 nm is "consumed" each time the drawing target substrate mounted on the stage moves in relative fashion by 490 nm, the drawing pattern formed on the substrate shrinks in the direction of the relative movement by a factor of a/b (where a/b<1.0) compared with the intended one.

On the other hand, when "a"=510 nm, as the bitmap data of resolution b=500 nm is "consumed" each time the drawing target substrate mounted on the stage moves in relative fashion by 510 nm, the drawing pattern formed on the substrate expands in the direction of the relative movement by a factor of a/b (where a/b>1.0) compared with the intended one.

In this way, if the direct drawing is performed by supplying the drawing data to the drawing engine without applying any corrections to it each time the drawing target surface moves in relative fashion by the distance "a"(≠b), the drawing pattern formed on the substrate expands or shrinks in the direction of the relative movement by a factor of a/b (where a/b=E/D) compared with the intended drawing pattern. Accordingly, to solve the image expansion/shrinkage problem in addition to the problem of the displacement and displacement buildup, the present invention applies correction to the drawing data itself in addition of the correction of the data supply timing.

That is, in the present invention, the drawing data to be supplied to the drawing engine at the above timing is corrected in advance so that the resulting drawing pattern will expand or shrink in the direction of the relative movement by a factor of b/a (where b/a=D/E) compared with the drawing pattern that would be obtained if the drawing data were used without applying any corrections to it. More specifically, the drawing data is corrected in advance so that the value of the ratio D/E between the design spacing D and the actual spacing E becomes equal to the image expansion/shrinkage rate of the drawing data in the direction of the relative movement.

As described above, the greatest feature of the drawing apparatus according to the present invention is that both the drawing data and the drawing data supply timing are corrected based on the difference between the design spacing and the actual spacing of the drawing devices in the drawing head. FIG. 1 is a block diagram showing the basic principle of the drawing apparatus according to the present invention.

According to the present invention, the drawing apparatus 1 for forming a desired drawing pattern by drawing the pattern directly on a drawing target surface 50 using a drawing engine 30 equipped with a plurality of drawing devices (not shown) arranged along a direction of relative movement of the drawing target surface 50, the drawing engine 30 being designed so that the design spacing of the thus arranged drawing devices is equal to a product of a unit pixel spacing in drawing data and an integer, comprises: correcting means 11 for generating corrected drawing data by correcting the drawing data based on the difference between the design spacing and the actual spacing of the drawing devices; and supplying means 12 for supplying the drawing engine 30 with just the corrected drawing data necessary for direct drawing to a drawing block that the drawing engine 30 can draw at a time on the drawing target surface 50, each time the drawing target substrate 50 moves in relative fashion by a distance corresponding to an actual pixel spacing that is obtained by dividing the actual spacing of the drawing devices by that integer. Here, the moving speed of the drawing target surface 50 relative to the drawing engine 30 is denoted by Vex. The drawing apparatus 1 according to the present invention performs the direct drawing based on the corrected drawing data supplied to the drawing engine 30.

In the drawing apparatus 1 equipped with a plurality of drawing engines #1 to #N (reference numeral 30), the correcting means 11 generates the corrected drawing data for each of the drawing engines #1 to #N (reference numeral 30) by using the actual spacing of the drawing devices measured on each of the drawing engines #1 to #N (reference numeral 30). The supplying means 12 supplies the corrected drawing data, generated for each of the drawing engines #1 to #N (reference numeral 30) by the correcting means 11, to each corresponding one of the drawing engines #1 to #N (reference numeral 30) at the timing determined for each of the drawing engines #1 to #N (reference numeral 30) based on the actual spacing of the drawing devices.

Here, the correcting means 11 and the supplying means 12 in the drawing apparatus 1 can each be implemented in a combination of hardware and a software program executable by a processing unit such as a computer. Constructing an apparatus for implementing the above processing and creating a program for causing a computer to execute the above processing can be easily accomplished by skilled persons who understand the explanation given hereinafter. Further, that the program for causing a computer to execute the above processing is stored on a recording medium is self-evident to skilled persons.

According to the drawing apparatus of the present invention, attention is paid to the fact that there occurs a difference between the design spacing and the actual spacing of the drawing devices in the drawing head, and the optimum corrected drawing data is generated by correcting the drawing data based on the above difference and the drawing pattern is formed based on the corrected drawing data by supplying the corrected drawing data to the drawing engine at the optimum timing based on the actual spacing of the drawing devices; as a result, stable drawing operations can be performed efficiently while maintaining the high resolution performance as intended.

According to the present invention, differences in resolution performance resulting from manufacturing variations among the drawing engines used in the drawing apparatus can be corrected for, and high resolution performance can be achieved, without imposing extra burden on other various functions within the drawing apparatus, and without involving a substantial increase in the amount of computation.

BRIEF DESCRIPTION OF THE DRAWINGS

The present invention will be more clearly understood from the description as set forth below with reference to the accompanying drawings, wherein:

FIG. 4 is a diagram showing numerical examples in the computation of FIG. 3;

FIG. 5 is a diagram showing an example of an array table for the case of numerical example 1 in FIG. 4;

FIG. 6 is a diagram showing an example of a count table obtained by modifying the array table of FIG. 5;

DESCRIPTION OF THE PREFERRED EMBODIMENTS

While the present invention can be applied to any drawing apparatus whether it be a direct exposure apparatus (maskless exposure apparatus), an inkjet drawing apparatus, or a printing apparatus such as a laser printer, the following description deals with a direct exposure apparatus as one embodiment of the invention.

Figure 1:
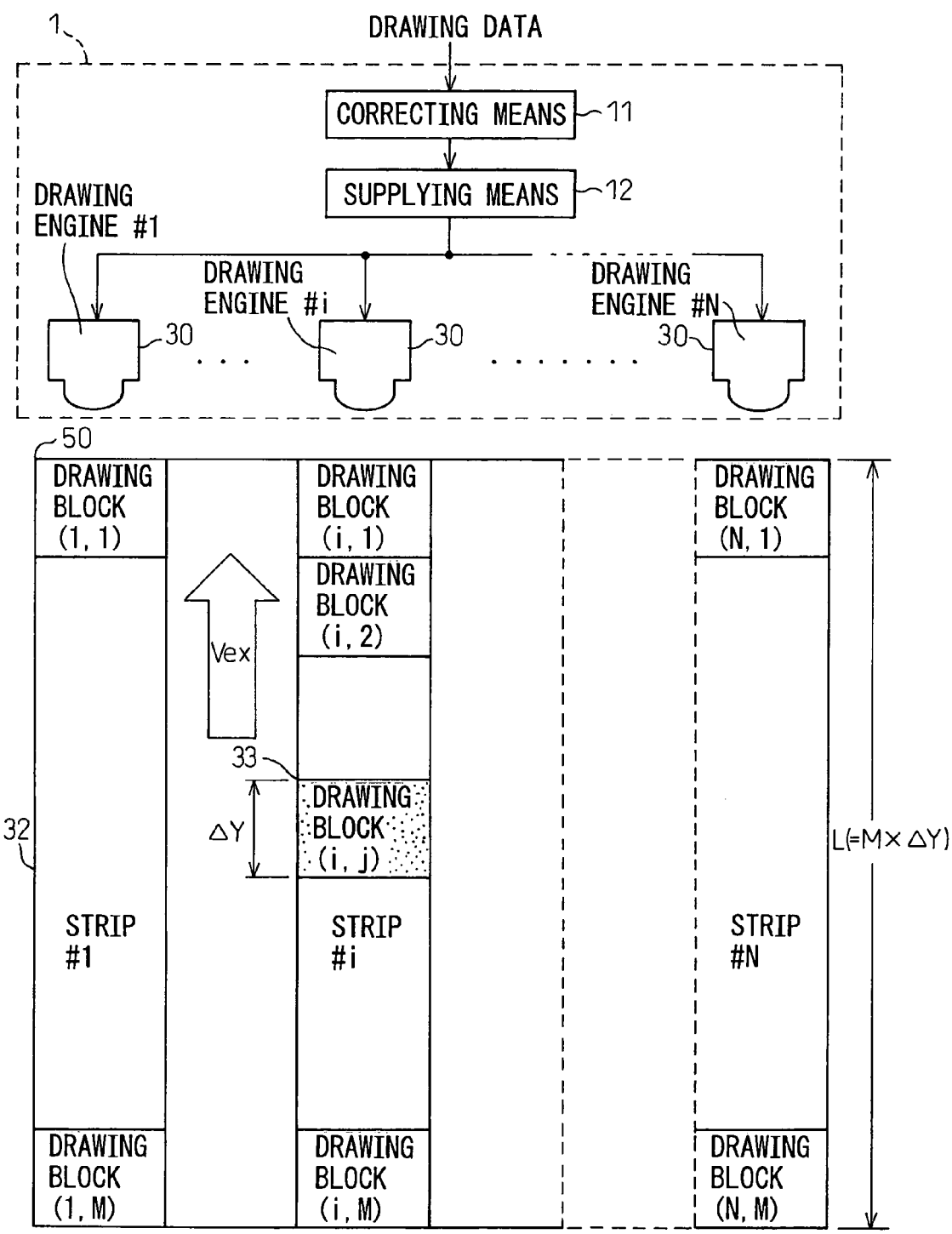
FIG. 1 is a block diagram showing the basic principle of a drawing apparatus according to the present invention.

As previously described with reference to FIG. 1, the exposure apparatus according to the present invention comprises: correcting means for generating corrected drawing data by correcting the drawing data (bitmap data of resolution b) based on the difference between the design spacing D (=pb, where p is an integer) and the actual spacing E of the light sources constituting the exposure head; and supplying means for supplying the drawing engine with just the corrected drawing data necessary for direct drawing to a drawing block that the drawing engine can draw at a time on the drawing target surface, each time the drawing target substrate moves in relative fashion by a distance corresponding to the actual pixel spacing "a" (=E/p) that is obtained by dividing the actual light source spacing E by the integer p. The exposure apparatus according to the present embodiment performs the direct exposure based on the corrected drawing data supplied to the drawing engine.

First, the correcting means in the present embodiment will be described.

As already described, even if the light source spacing is designed so that the spacing becomes equal to an integral multiple, p, of the resolution b of the bitmap data (the design spacing D=pb), and the actual hardware is manufactured based on this design, the actual light source spacing E will be different from the design spacing D (that is, E≠D). Therefore, in the present embodiment, the actual light source spacing E is measured in advance by using an optical imaging means such as a camera. Once the light source spacing is measured, the direct exposure according to the present invention can thereafter be performed over a long period of time by using the actual spacing E but, considering the aging of the apparatus over time, the light source spacing may be re-measured, for example, at the time of the maintenance of the exposure apparatus.

In the present embodiment, when correcting the drawing data, the value D/E of the ratio (D:E) between the design light source spacing D and the actual spacing E is taken as representing the image expansion/shrinkage rate of the drawing data in the direction of the relative movement. The expansion/shrinkage rate can be modified as shown by the equation (2) below.

$$\text{Expansion/shrinkage rate} = D/E = pb/pa = b/a = \text{Unit pixel spacing/Actual pixel spacing} \quad (2)$$

In this way, the expansion/shrinkage rate can be defined by the unit pixel spacing (resolution of bitmap data) b and the actual pixel spacing "a". When the coordinates of an arbitrary point in the drawing data before correction are expressed as ($\alpha$, $\beta$), and its corresponding coordinates in the corrected drawing data as ($\alpha'$, $\beta'$), the following correction equation (3) is obtained using a coordinate transformation matrix. When viewed from the standpoint of the data processing amount, as the following correction equation (3) increases the number of multiplications only by one compared with the case where no corrections are applied to the drawing data, the increase in the computation has a negligible effect on the data processing amount in the system as a whole.

$$\begin{pmatrix} \alpha' \\ \beta' \end{pmatrix} = \begin{pmatrix} 1 & 0 \\ 0 & b/a \end{pmatrix} \begin{pmatrix} \alpha \\ \beta \end{pmatrix} \quad (3)$$

The above correction equation (3) has been deduced by only considering the expansion/shrinkage in the direction of the relative movement but, in actuality, some kind of image expansion/shrinkage also occurs in the direction orthogonal to the direction of the relative movement. When the correction coefficient for it is denoted by x, the following correction equation (4) is obtained. When viewed from the standpoint of the data processing amount, since the following correction equation (4) increases the number of multiplications only by two compared with the case where no corrections are applied to the drawing data, the increase in the computation has a negligible effect on the data processing amount in the system as a whole.

$$\begin{pmatrix} \alpha' \\ \beta' \end{pmatrix} = \begin{pmatrix} x & 0 \\ 0 & b/a \end{pmatrix} \begin{pmatrix} \alpha \\ \beta \end{pmatrix} \quad (4)$$

Further, if a correction in the rotating direction is to be applied, the above correction equation (4) can be further generalized as shown by the following correction equation (5). When viewed from the standpoint of the data processing amount, as the following correction equation (5) increases the number of multiplications only by four and the number of additions only by two compared with the case where no corrections are applied to the drawing data, the increase in the computation has a negligible effect on the data processing amount in the system as a whole.

$$\begin{pmatrix} \alpha' \\ \beta' \end{pmatrix} = \begin{pmatrix} x & e_{12} \\ e_{21} & b/a \end{pmatrix} \begin{pmatrix} \alpha \\ \beta \end{pmatrix} \quad (5)$$

Generally $e_{12} \neq 0$, $e_{21} \neq 0$

When the exposure apparatus is equipped with a plurality of drawing engines, at least one of the above correction equations (3) to (5) should be prepared for each drawing engine. For this purpose, the actual light source spacing E must be measured on each drawing engine. It is preferable that the data unique to the respective drawing engines be stored in the form of one of the correction equations (3) to (5) as a file in the computer that performs the data processing.

If, besides the correction by one of the above correction equations (3) to (5), there is a need to apply a dynamic correction in order to address the expansion/shrinkage of the exposure target substrate itself or an alignment error, then a calculation equation f(A) for this correction should be further added. For example, if the calculation equation f(A) is added to the above correction equation (5), the following correction equation (6) in which all the corrections expected to be needed in the exposure process are reflected can be obtained.

$$\begin{pmatrix} \alpha' \\ \beta' \end{pmatrix} = f(A) \begin{pmatrix} x & e_{12} \\ e_{21} & b/a \end{pmatrix} \begin{pmatrix} \alpha \\ \beta \end{pmatrix} \quad (6)$$

Generally $e_{12} \neq 0$, $e_{21} \neq 0$

The correction calculation equation f(A) for addressing the expansion/shrinkage of the exposure target substrate itself or an alignment error is much more complicated and involves much more computation than any of the above correction equations (3) to (5). From this point also, it can be said that the amount of computation required by any one of the above correction equations (3) to (5) according to the present embodiment is negligibly small compared with the data processing amount in the system as a whole.

Thus, according to the present embodiment, variations associated with the expansion/shrinkage of the exposure pattern formed by each drawing engine can be corrected without imposing extra burden on other various functions within the exposure apparatus, and without involving a substantial increase in the amount of computation.

Next, the supplying means in the present embodiment will be described.

In the present embodiment, each time the exposure target surface moves in relative fashion by a distance corresponding to the actual pixel spacing "a" ($\neq$b) which is obtained by dividing the premeasured actual light source spacing E by the integer p, the corrected drawing data is supplied to the drawing engine. When the exposure apparatus is equipped with a plurality of drawing engines, the corrected drawing data generated for each drawing engine is supplied to the corresponding drawing engine each time the exposure target surface moves in relative fashion by a distance corresponding to the actual pixel spacing "a" ($\neq$b) obtained for that drawing engine. That is, the corrected drawing data generated for each drawing engine is supplied to the corresponding drawing engine in accordance with the timing defined for that drawing engine by the actual light source spacing measured on that drawing engine.

The timing with which the supplying means supplies the corrected drawing data to each corresponding drawing engine is determined by the synchronizing signal; in the present embodiment, as the timing for supplying the corrected drawing data is different for each drawing engine, the synchronizing signal corresponding to each drawing engine must be created independently of the others. Here, as there is a constant phase relationship between the different synchronizing signals, the present embodiment creates a stable signal that serves as a reference for these synchronizing signals. This signal will be referred to as the "master clock." The moving speed, relative to the light source, of the stage on which the exposure target substrate is mounted is controlled by the stage controller; therefore, in the present embodiment, the master clock is created based on information concerning the amount of the stage movement obtained by the stage controller. Generally, the stage controller is equipped, for example, with a laser interferometer as a device for detecting the amount of the stage movement. In the present embodiment, this laser interferometer is used as a master clock generating means, and the master clock is created based on the output result of the laser interferometer. That is, the master clock is created from the output pulse of the laser interferometer that has the function of outputting a pulse each time the stage moves by a prescribed distance f.

The wavelength f of the master clock (i.e., the wavelength of the output pulse of the laser interferometer) is sufficiently shorter than the actual pixel spacing "a" obtained by dividing the actual light source spacing E by the integer p. To give an example, f=19.776 nm and "a"=490 nm.

$$0 < f \ll a \qquad (7)$$

Therefore, in the present embodiment, the synchronizing signals are created by suitably dividing the frequency of the master clock.

Figure 2:
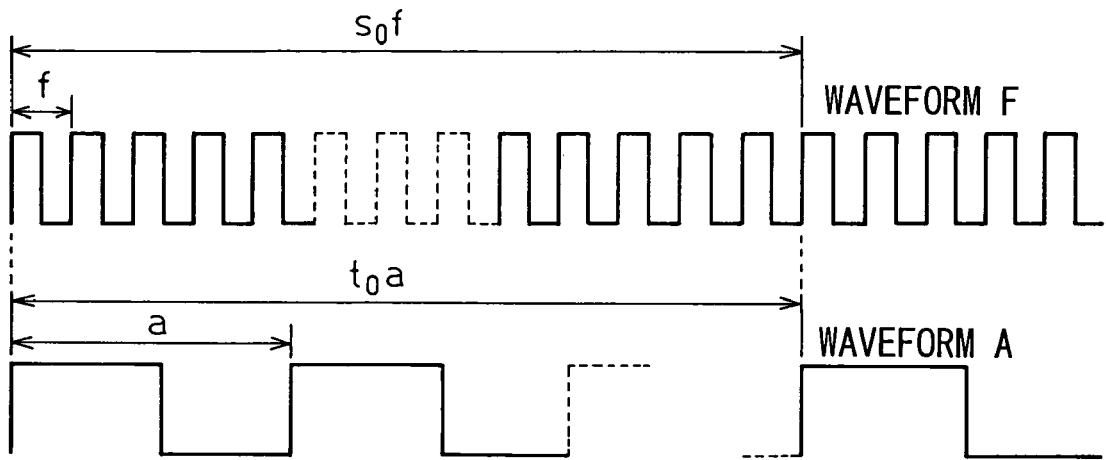
FIG. 2 is a diagram for explaining how a frequency dividing scheme is determined.

FIG. 2 is a diagram for explaining how the frequency dividing scheme is determined. Here, the waveform relating to the master clock having the wavelength f is called the waveform F, and the waveform relating to the actual pixel spacing "a" is called the waveform A.

As the frequency dividing function is generally implemented in the form of an electronic circuit, the frequency dividing scheme must be determined so as to be implementable within the finite size of the electronic circuit. Here, for arbitrary positive real numbers f and a that satisfy the relation (7), consider the following equation (8) where s and t are arbitrary integers.

$$s \times f = t \times a \qquad (8)$$

Here, if $$\left. \begin{array}{l} \exists (s_0, t_0) \neq (0, 0) \\ (t_0 \times a)_{mod\, f} = 0 \\ s_0 = \dfrac{t_0 \times a}{f} \end{array} \right\} \qquad (9)$$

then the waveform F and the waveform A repeat the same phase relationship, with $s_0$ cycle as one cycle for the waveform F and with $t_0$ cycle as one cycle for the waveform A, as shown in FIG. 2. Therefore, if the frequency dividing scheme for the one cycle which is a finite period can be determined then, by repeating this one cycle thereafter, the frequency division can be performed for an infinite length of time. This means that the frequency dividing function can be implemented in an electronic circuit of a finite size.

Figure 3:
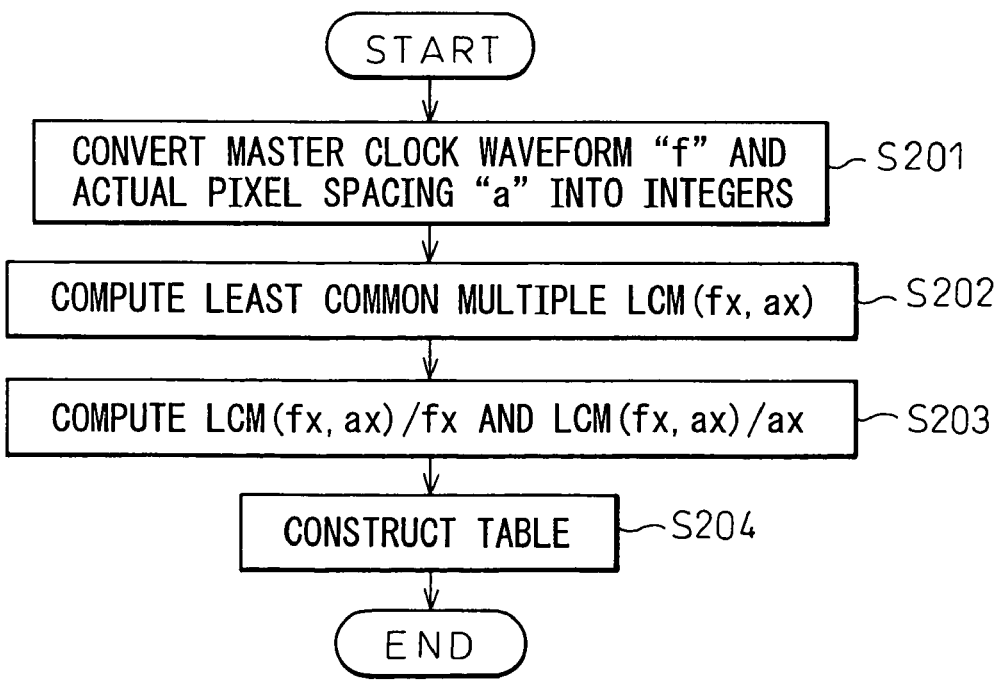
FIG. 3 is a flowchart illustrating a synchronizing signal generation algorithm according to an embodiment of the present invention.

FIG. 3 is a flowchart illustrating a synchronizing signal generation algorithm according to the embodiment of the present invention.

Finding ($s_0$, $t_0$) in the equations (8) and (9) is nothing less than finding the least common multiple of the wavelength f of the master clock and the actual pixel spacing "a". However, as the wavelength f of the master clock is the wavelength of the pulse that the laser interferometer outputs, while the actual pixel spacing "a" is the value obtained by dividing the actual light source spacing E by the integer p, the wavelength f of the master clock and the actual pixel spacing "a" are both real numbers. As it is difficult to compute the least common multiple from f and a which are both real numbers, in the present embodiment, in step S201 of FIG. 3 the values of the wavelength f of the master clock and the actual pixel spacing "a" are respectively converted into integers after expressing them in the same unit. More specifically, after expressing f and "a" in the same unit, for example, in nm (nanometers), f and "a" are respectively multiplied by a power of 10 so that the smallest significant figure becomes an integer, and the resulting values are written as fx and ax, respectively. For example, if there are significant figures down to three decimal places, f and "a" are respectively multiplied by the third power of 10, to obtain fx and ax.

Then, in step S202, the least common multiple LCM(fx, ax) of fx and ax is computed. Next, in step S203, the least common multiple LCM(fx, ax) is divided by fx to obtain the value LCM(fx, ax)/fx, and likewise, the least common multiple LCM(fx, ax) is divided by ax to obtain the value LCM(fx, ax)/ax. FIG. 4 is a diagram showing numerical examples in the computation of FIG. 3. These numerical examples are shown by assuming that the wavelength f of the master clock is 19.776 nm and that the actual pixel spacing "a" is 500 nm (numerical example 1), 490 nm (numerical example 2), and 510 nm (numerical example 3). As the value of the wavelength f of the master clock is significant to three decimal places, f and "a" are respectively multiplied by the third power of 10, to obtain fx and ax. Using fx and ax, LCM(fx, ax), LCM(fx, ax)/fx, and LCM (fx, ax)/ax such as shown in FIG. 4 are obtained.

Then, in step S204, the values of integer s for which the absolute value |s×fx−t×ax| is the smallest is obtained for all integers t that satisfy the following equation (10) and, using the results as array elements s[t], an array table is constructed and stored.

$$0 \le t \le \dfrac{LCM(fx,\, ax)}{ax} \qquad (10)$$

Here, since the absolute value |s[t]×fx−t×ax| is always smaller than f, the absolute value |s[t]×fx−t×ax| gives the worst-case value for the error of each synchronizing signal. From the relation (7) and the relation a≅b, the wavelength f of the master clock is sufficiently smaller than the resolution b of the bitmap data; therefore, it can be said that the effect of the error of the synchronizing signal on the exposure result is negligible.

FIG. 5 is a diagram showing an example of the array table for the case of the numerical example 1 in FIG. 4. In the array table shown, s[1]=25, for example, can be interpreted as indicating that "the number of rising or falling edges of the master clock pulse is counted and, when the count of the number has reached 25, the first synchronizing signal is generated." Likewise, s[8]=202, for example, can be interpreted as indicating that "when the count of the number has reached 202, the eighth synchronizing signal is generated."

Accordingly, if the array table is constructed and stored in advance in a prescribed memory within the exposure apparatus, with provisions made so that "the number of rising or falling edges of the master clock pulse is counted and, when the count of the number has reached the value stored in the array table, the synchronizing signal is generated," then it follows that "the synchronizing signal that serves as a reference for the timing with which the supplying means supplies the corrected drawing data to the drawing engine has been generated based on the master clock."

FIG. 6 is a diagram showing an example of a count table obtained by modifying the array table of FIG. 5.

The array table of FIG. 5 requires a large capacity memory because the number of digits of the s[t] value to be created and stored in advance can become very large. In view of this, the count table of FIG. 6 is constructed by modifying the array table of FIG. 5 in order to reduce the memory capacity. More specifically, the difference between the array elements s[t+1] and s[t] in the array table of FIG. 5 is stored as an array element q[t] in the count table of FIG. 6.

In the count table shown, q[0]=25, for example, can be interpreted as indicating that "the number of rising or falling edges of the master clock pulse is counted and, when the count of the number has reached 25, the first synchronizing signal is generated," and q[1]=26, for example, can be interpreted as indicating that "the second synchronizing signal is generated when the count of the number has increased by 26 after generating the first synchronizing signal," while q[2]=25, for example, can be interpreted as indicating that "the third synchronizing signal is generated when the count of the number has increased by 25 after generating the second synchronizing signal." Then, after generating the 618th synchronizing signal, the process returns to the beginning of the count table and, when the count of the number has increased by q[0], that is, 25, then the 619th synchronizing signal is generated. Thereafter, the same process is repeated.

In this way, "circulating type frequency dividing" can be accomplished using the count table of FIG. 6. Furthermore, as the number of digits of the q[t] value to be stored is reduced, the memory capacity can be reduced.

Figure 7:
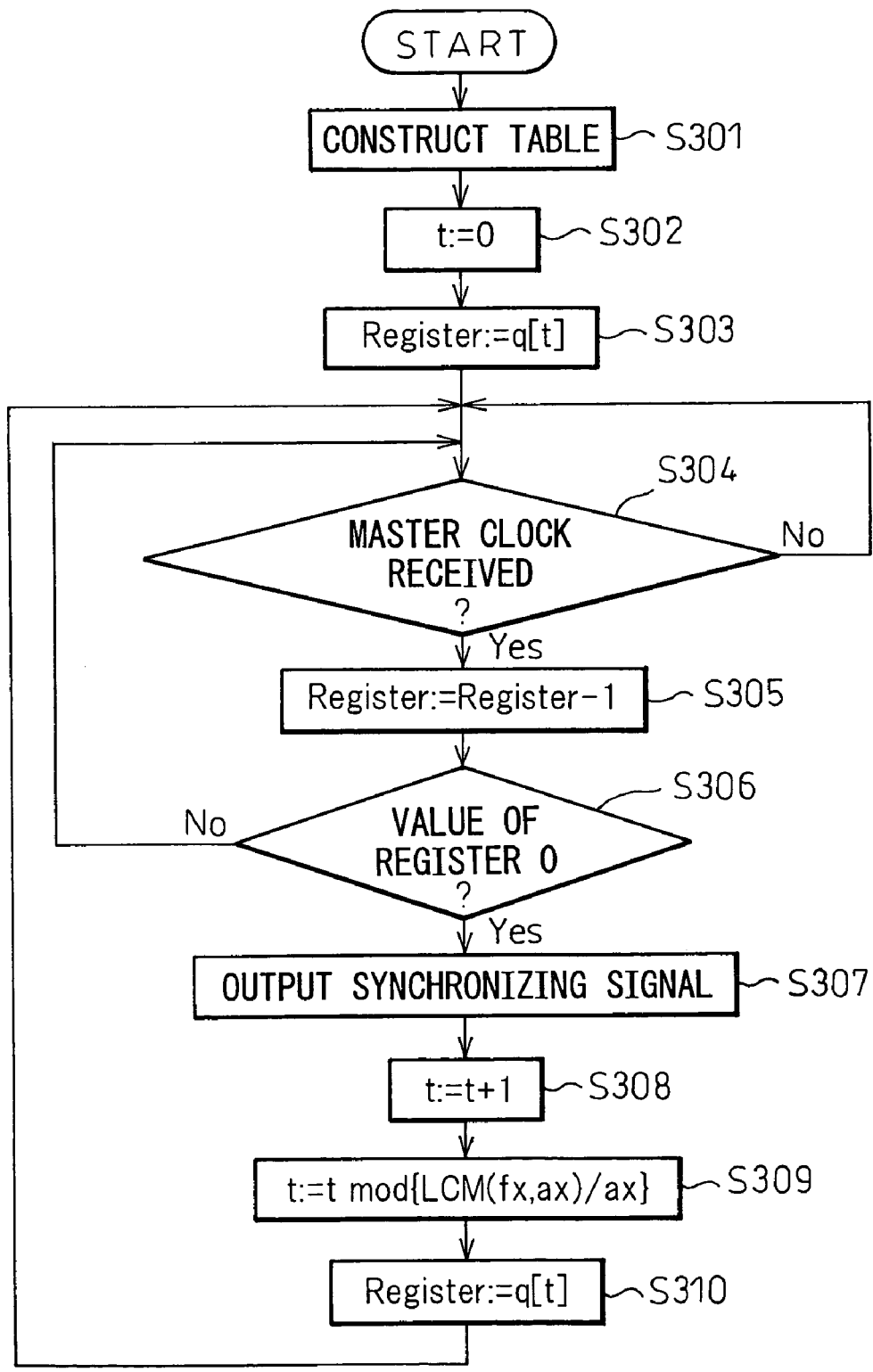
FIG. 7 is a flowchart illustrating a synchronizing signal generation algorithm using the count table according to the embodiment of the present invention.

FIG. 7 is a flowchart illustrating a synchronizing signal generation algorithm using the count table according to the embodiment of the present invention.

First, in step S301, the count table containing the array elements q(t) such as described above is constructed. The count table is constructed as described with reference to FIGS. 3 to 6, and the constructed count table is stored, for example, in a storage device within the computer that controls the exposure apparatus. During the exposure process, the count table is loaded into the work memory within the computer, and used as needed when carrying out the following steps.

In step S302, t is set to 0 as an initial setting for the synchronizing signal generation. Next, in step S303, q(t) is loaded into a register.

In step S304, it is determined whether the master clock is received or not. When the master clock is received, the process proceeds to step S305, where the value of the register is decremented by 1. In step S306, it is determined whether the value of the register has become 0. By repeatedly performing the above steps S304 to S306, the process for counting the number of rising or falling edges of the master clock pulse (hereinafter simply referred to as the "count process") is accomplished.

Then, when it is determined in step S306 that value of the register has become 0, the synchronizing signal is output in step S307.

In step S308, t is incremented by 1. In step S309, "t mod {LCM(fx, ax)/ax}" is computed (computation of the remainder), where t is the value set in step S308, and the result of the computation is set as t. In step S310, q(t) that uses the value of t set in step S309 is loaded into the register. With the above steps S308 to S310, the previously described "circulating type frequency dividing" is accomplished in which, after generating the final synchronizing signal defined in the count table, the process returns to the beginning of the count table to repeat the count process for generating the first synchronizing signal.

Figure 8:
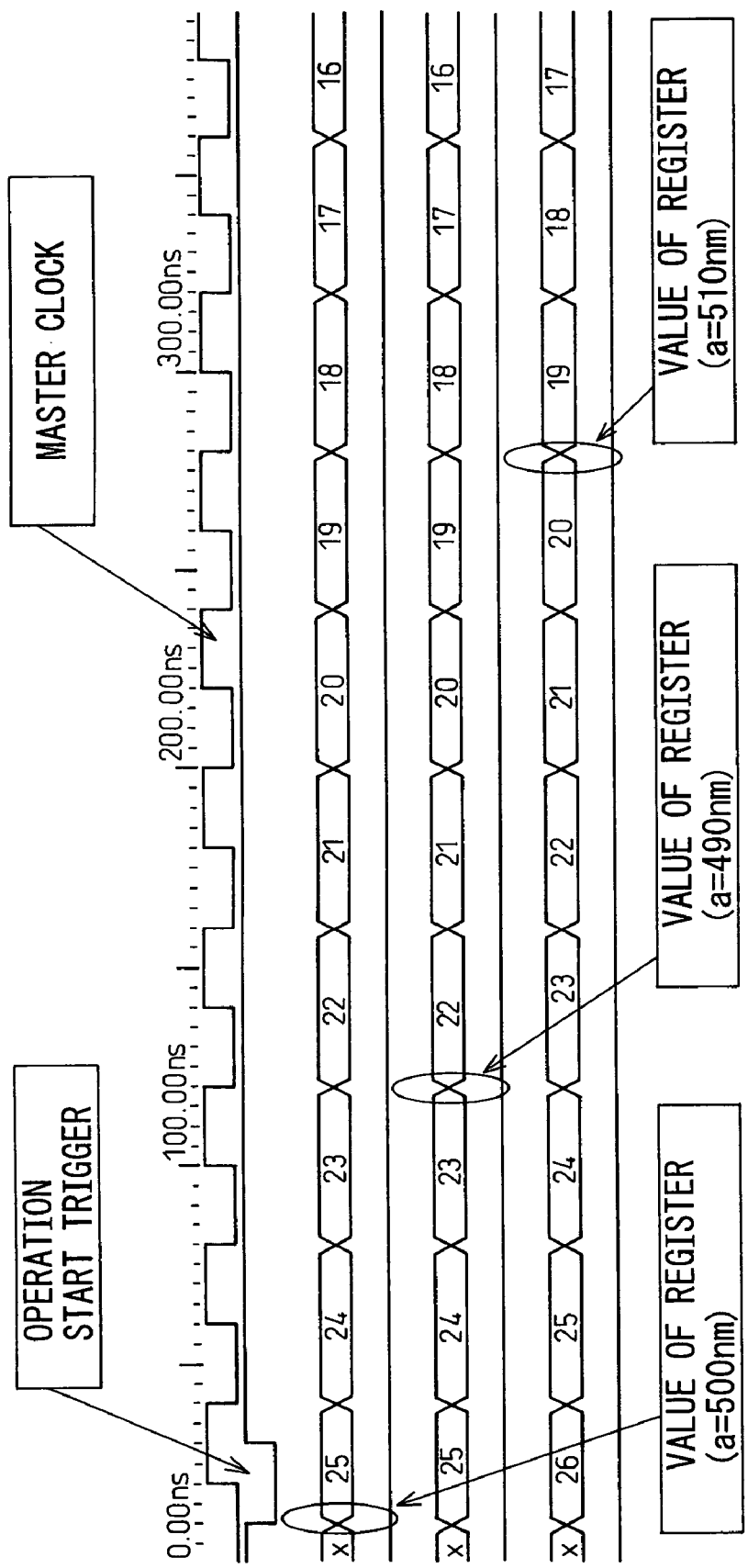
FIG. 8 is a diagram showing the results of the simulation conducted by using the numerical examples shown in FIG. 4 and by applying the synchronizing signal generation algorithm shown in the flowchart of FIG. 7, the diagram specifically showing the condition immediately after starting the process.
Figure 9:
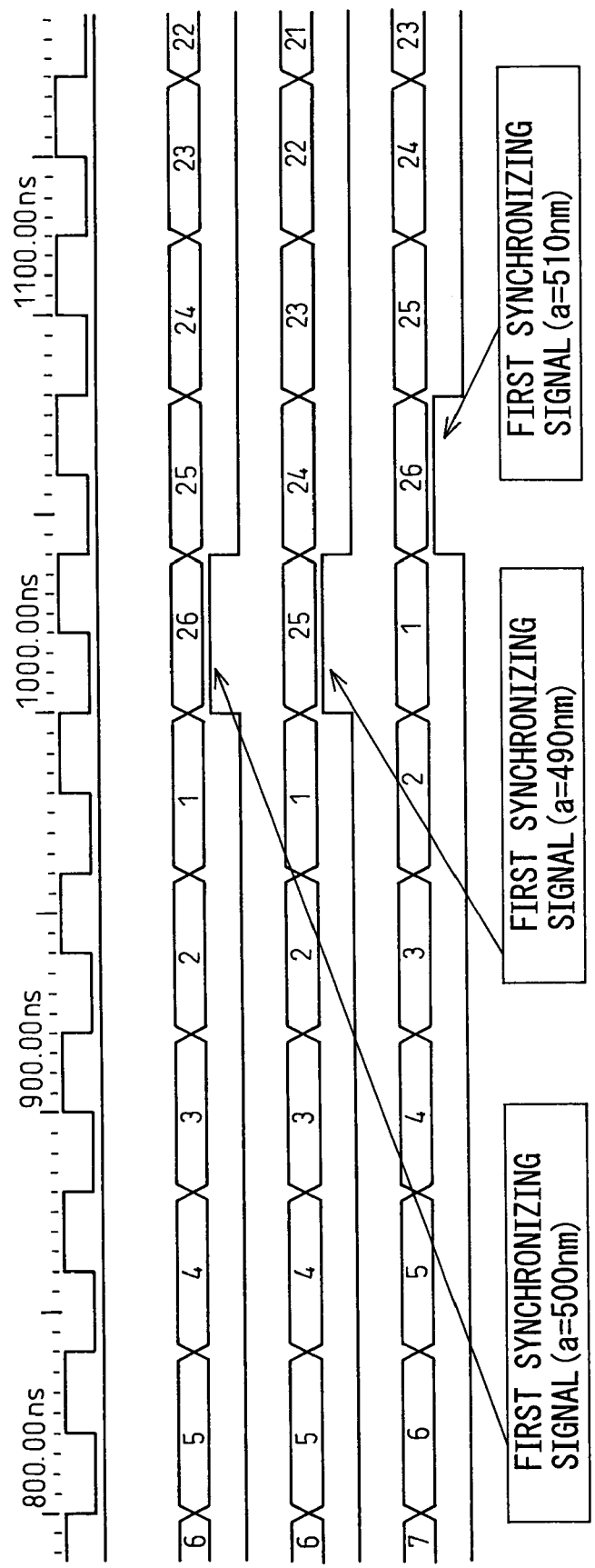
FIG. 9 is a diagram showing the results of the simulation conducted by using the numerical examples shown in FIG. 4 and by applying the synchronizing signal generation algorithm shown in the flowchart of FIG. 7, the diagram specifically showing the generation of a first synchronizing signal.
Figure 10:
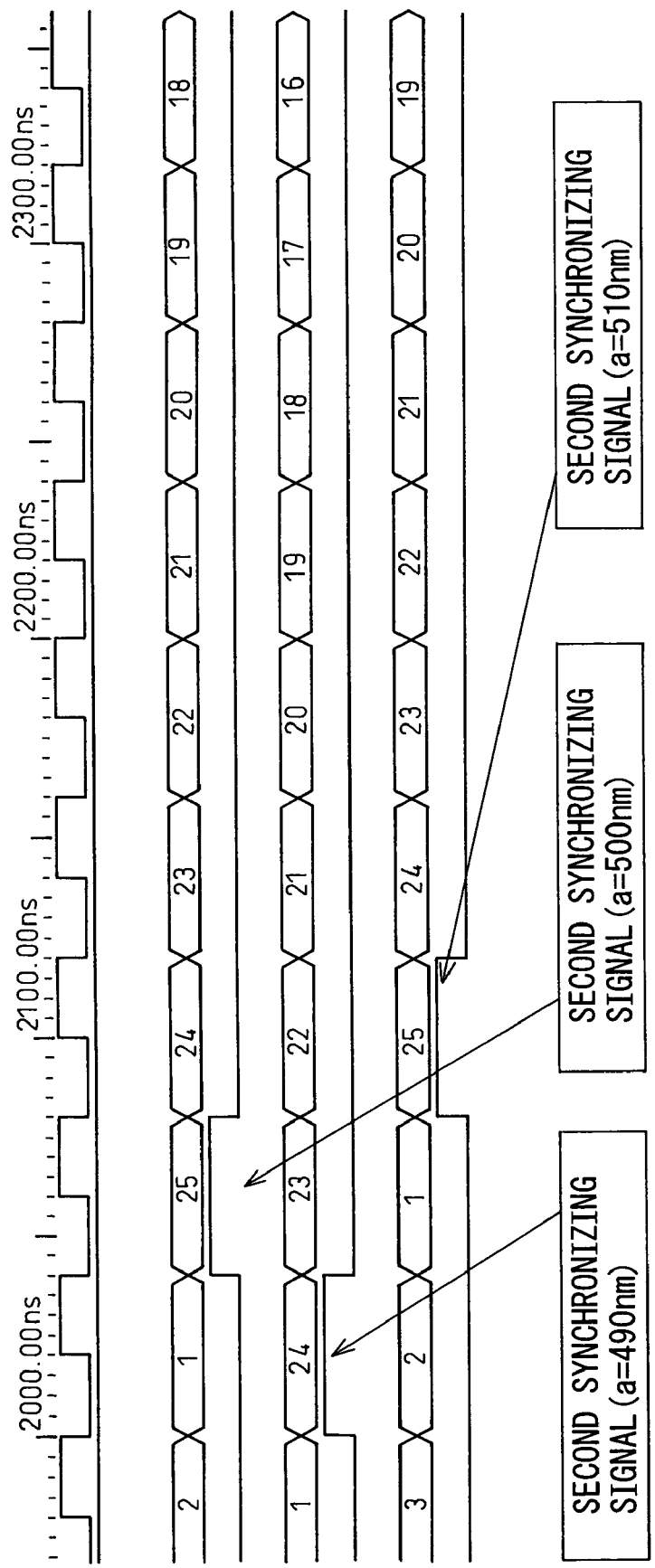
FIG. 10 is a diagram showing the results of the simulation conducted by using the numerical examples shown in FIG. 4 and by applying the synchronizing signal generation algorithm shown in the flowchart of FIG. 7, the diagram specifically showing the generation of a second synchronizing signal.
Figure 11:
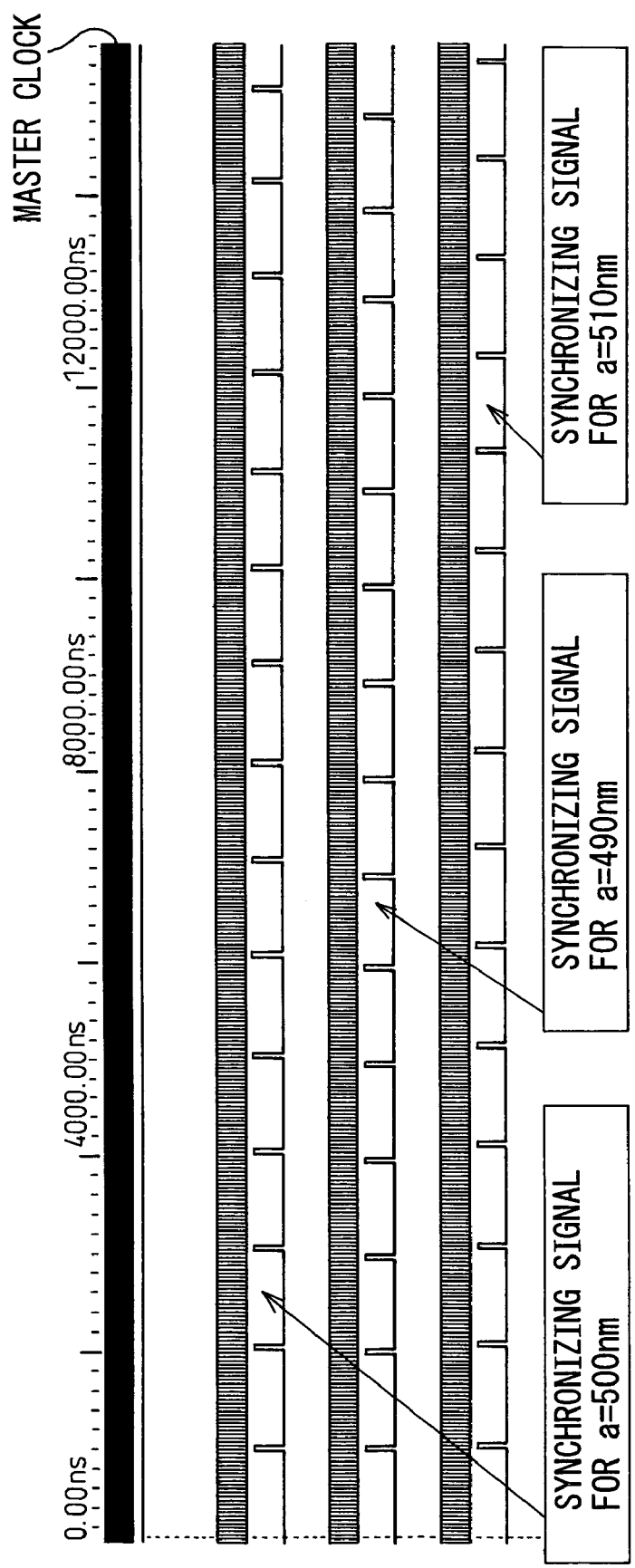
FIG. 11 is a diagram showing the results of the simulation when the simulation shown in FIGS. 8 to 10 was performed for an extended period of time.

FIGS. 8 to 10 are diagrams showing the results of the simulation conducted by using the numerical examples shown in FIG. 4 and by applying the synchronizing signal generation algorithm shown in the flowchart of FIG. 7: FIG. 8 is a diagram showing the condition immediately after starting the process, FIG. 9 is a diagram showing the generation of the first synchronizing signal, and FIG. 10 is a diagram showing the generation of the second synchronizing signal. FIG. 11 is a diagram showing the results of the simulation when the simulation shown in FIGS. 8 to 10 was performed for an extended period of time. Here, the above algorithm was written in the Verilog language for the three examples shown in FIG. 4, and the simulation was performed using a Verilog simulator. In FIGS. 8 to 10, numerical values other than those (e.g., 200.00 ns) on the scale of the time axis each indicate the value of t in the count table (that is, the count of the number of rising or falling edges of the master clock pulse). From FIGS. 8 to 11, it can be seen that a different synchronizing signal is created for each different actual pixel spacing "a". This means that, even when the actual pixel spacing "a" is different for each drawing engine, an optimum synchronizing signal for each drawing engine can be created. That is, by using this synchronizing engine, the corrected drawing data can be supplied to each drawing engine with the optimum timing based on the actual light source spacing in that drawing engine.

Figure 12:
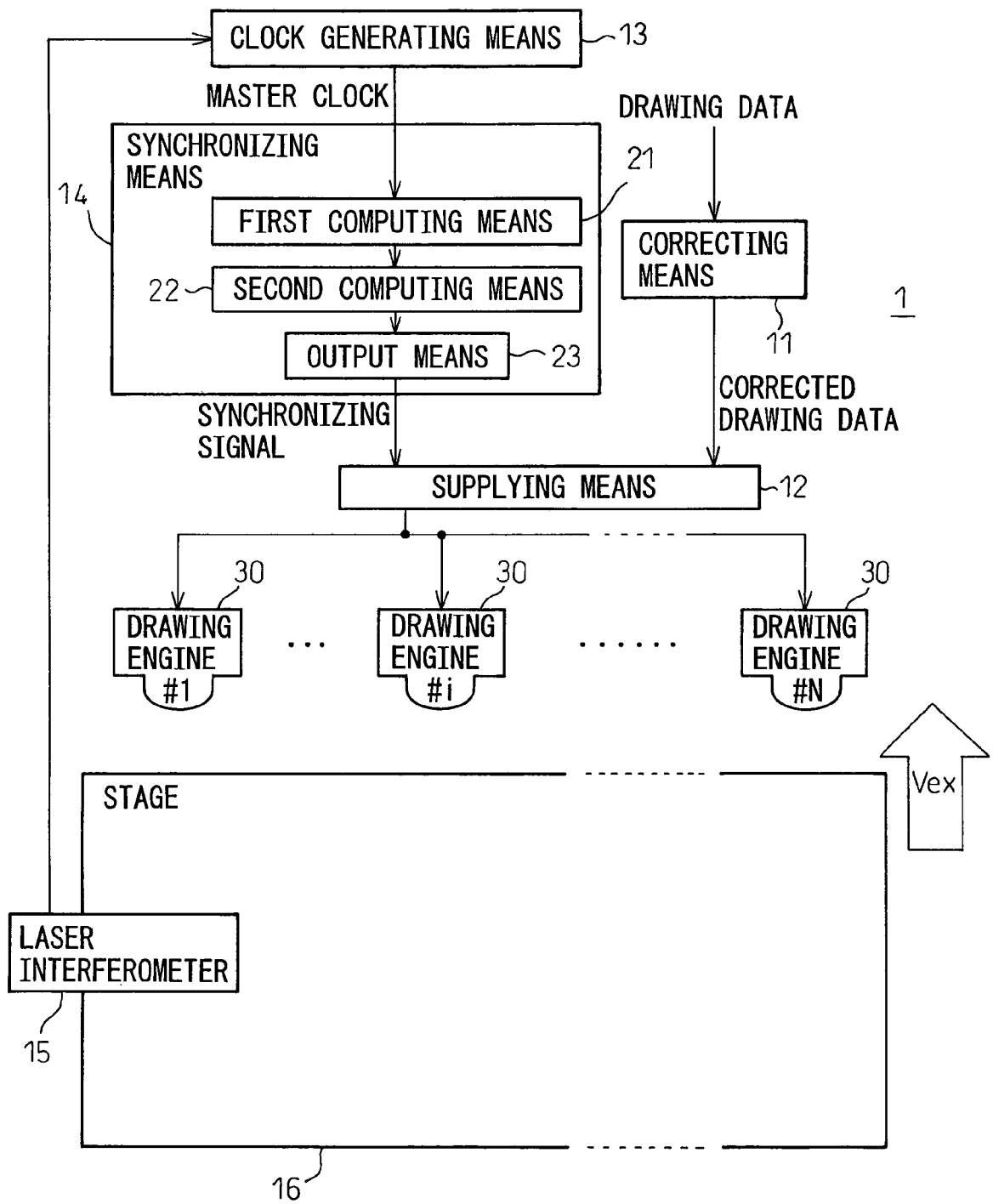
FIG. 12 is a basic block diagram of an exposure apparatus according to the embodiment of the present invention.

FIG. 12 is a basic block diagram of the exposure apparatus according to the embodiment of the present invention.

According to the present embodiment, the exposure apparatus 1, which forms a desired exposure pattern by directly exposing the exposure target surface in the desired pattern by using the drawing engines #1 to #N (reference numeral 30), each equipped with a plurality of light sources (not shown) arranged along the direction of the relative movement of the stage 16 with the exposure target substrate (not shown) mounted thereon, each drawing engine being designed so that the design spacing D of the light sources is equal to an integral multiple, p, of the unit pixel spacing b in drawing data, comprises correcting means 11, supplying means 12, clock generating means 13, and synchronizing means 14. The synchronizing means 14 includes a first computing means 21, a second computing means 22, and an output means 23.

The speed Vex, relative to the drawing engines #1 to #N (reference numeral 30), of the stage 16 on which the exposure target substrate is mounted is controlled by the stage controller (not shown). In the present embodiment, the stage controller is equipped with a laser interferometer 15 as a device for detecting the amount of movement of the stage 16. The laser interferometer 15 outputs a pulse each time the stage moves a prescribed distance f. For example, when a He—Ne gas laser is used, as its wavelength is about 632.84 nm, f=19.776 nm is obtained using a suitable frequency multiplier. In the present embodiment, the laser interferometer 15 is used as the device for detecting the amount of the stage movement, but use may be made of any other suitable device, provided that the device can output a stable signal for a given amount of movement of the stage 16; for example, a position detecting device using a rotary encoder may be used.

The clock generating means 13, based on the output result of the laser interferometer 15, generates the master clock which is output each time the stage 16 with the exposure target substrate mounted thereon moves by the unit distance f at the relative speed Vex. That is, the pulse that the laser interferometer 15 outputs each time the stage 16 moves by the given distance f is taken as the master clock.

The correcting means 11 corrects the drawing data for each of the drawing engines #1 to #N (reference numeral 30) based on the difference between the design spacing D of the light sources and the actual light source spacing E measured for each of the drawing engines #1 to #N (reference numeral 30) (i.e., D≠E), and thus generates the corrected drawing data for each of the drawing engines #1 to #N (reference numeral 30).

For each of the drawing engines #1 to #N (reference numeral 30), the synchronizing means 14 generates, based on the master clock, the synchronizing signal that serves as a reference for the timing with which the supplying means 12 supplies the corrected drawing data to each of the drawing engines #1 to #N (reference numeral 30). This will be described in further detail below.

The first computing means 21 in the synchronizing means 14 computes the least common multiple LCM(f, a) of the actual pixel spacing "a" and the wavelength f of the periodically output master clock both expressed in the same unit. The least common multiple LCM(f, a) is computed for each of the drawing engines #1 to #N (reference numeral 30) by using the actual pixel spacing "a" measured for each of the drawing engines #1 to #N (reference numeral 30).

The second computing means 22 in the synchronizing means 14 computes the array element s[t] for which the absolute value |s[t]×f−t×a| is the smallest, for each integer t contained in the interval from zero to the value "LCM(f, a)/a" that is obtained by dividing the least common multiple LCM(f, a) by the actual pixel spacing "a", and thereby constructs the array table or the count table. The array table or the count table is constructed for each of the drawing engines #1 to #N (reference numeral 30) by using the least common multiple LCM(f, a) computed for each of the drawing engines #1 to #N (reference numeral 30). The array table or the count table thus constructed is stored in a storage medium (ROM) within the synchronizing means 14.

The output means 23 refers to the array table or the count table thus stored, and outputs the synchronizing signal to the supplying means 12 when the count of the number of rising or falling edges of the master clock pulse reaches a predetermined value. Using the array table or the count table constructed for each of the drawing engines #1 to #N (reference numeral 30), this synchronizing signal is output to the supplying means 12 as the synchronizing signal for the corresponding one of the drawing engines #1 to #N (reference numeral 30).

Based on the synchronizing signal created for each of the drawing engines #1 to #N (reference numeral 30) and received from the output means 23 in the synchronizing means 14, the supplying means 12 supplies the corrected drawing data generated for each corresponding one of the drawing engines #1 to #N (reference numeral 30) to the corresponding one of the drawing engines #1 to #N (reference numeral 30) in an amount just necessary for the direct exposure of the exposure block on the exposure target surface that the corresponding one of the drawing engines #1 to #N (reference numeral 30) can expose at a time. Using the synchronizing signal received from the output means 23 in the synchronizing means 14, the corrected drawing data can be supplied each time the stage 16 on which the exposure target substrate is mounted moves in relative fashion by a distance corresponding to the actual pixel spacing "a" that is obtained by dividing the actual light source spacing E by the integer p.

The corrected drawing data generated for each of the drawing engines #1 to #N (reference numeral 30) by the correcting means 11 is supplied from the supplying means 12 to each corresponding one of the drawing engines #1 to #N (reference numeral 30) in accordance with the timing defined by the actual light source spacing E for each of the drawing engines #1 to #N (reference numeral 30). Each of the drawing engines #1 to #N (reference numeral 30) performs the direct exposure based on the corrected drawing data thus supplied.

In the above-described embodiment, the synchronizing signal was created using the array table or the count table. In this case, when computing the least common multiple LCM(f, a) of the actual pixel spacing "a" and the frequency f of the master clock, both values were first expressed in the same unit, and then multiplied until the smallest significant figure became an integer. That is, after expressing f and a in the same unit, for example, in nm (nanometers), the frequency f of the master clock and the actual pixel spacing "a" were respectively multiplied by a power of 10 so that the smallest significant figure became an integer, and the least common multiple of the resulting integers fx and ax was obtained. However, in cases where the generation of high-precision wiring patterns is required, for example, the number of significant figures to the right of the decimal point in the frequency f of the master clock and/or the actual pixel spacing "a" becomes large, and if these values are converted into integers as described above, the values of fx and ax become very large. As a result, even if the count table is used instead of the array table to generate the synchronizing signals, a large capacity memory becomes necessary. In view of this, a modified example of the synchronizing signal generation algorithm will be described that does not require a large capacity memory even when generating high-precision wiring patterns.

The synchronizing means according to this modified example comprises:

first accumulating means for storing an accumulated value of the wavelength of the master clock;

first adding means for adding, each time the master clock is received, the wavelength of the master clock to the accumulated value of the wavelength of the master clock stored in the first accumulating means;

second accumulating means for storing an accumulated value of the actual pixel spacing;

subtracting means for computing an absolute difference between the accumulated value of the wavelength of the master clock stored in the first accumulating means and the accumulated value of the actual pixel spacing stored in the second accumulating means;

judging means for judging whether the absolute difference is smaller than or larger than the wavelength of the master clock;

output means for outputting the synchronizing signal when it is judged by the judging means that the absolute difference is smaller than the wavelength of the master clock; and second adding means for adding the actual pixel spacing to the accumulated value of the actual pixel spacing stored in the second accumulating means, when it is judged by the judging means that the absolute difference is smaller than the wavelength of the master clock.

Figure 13:
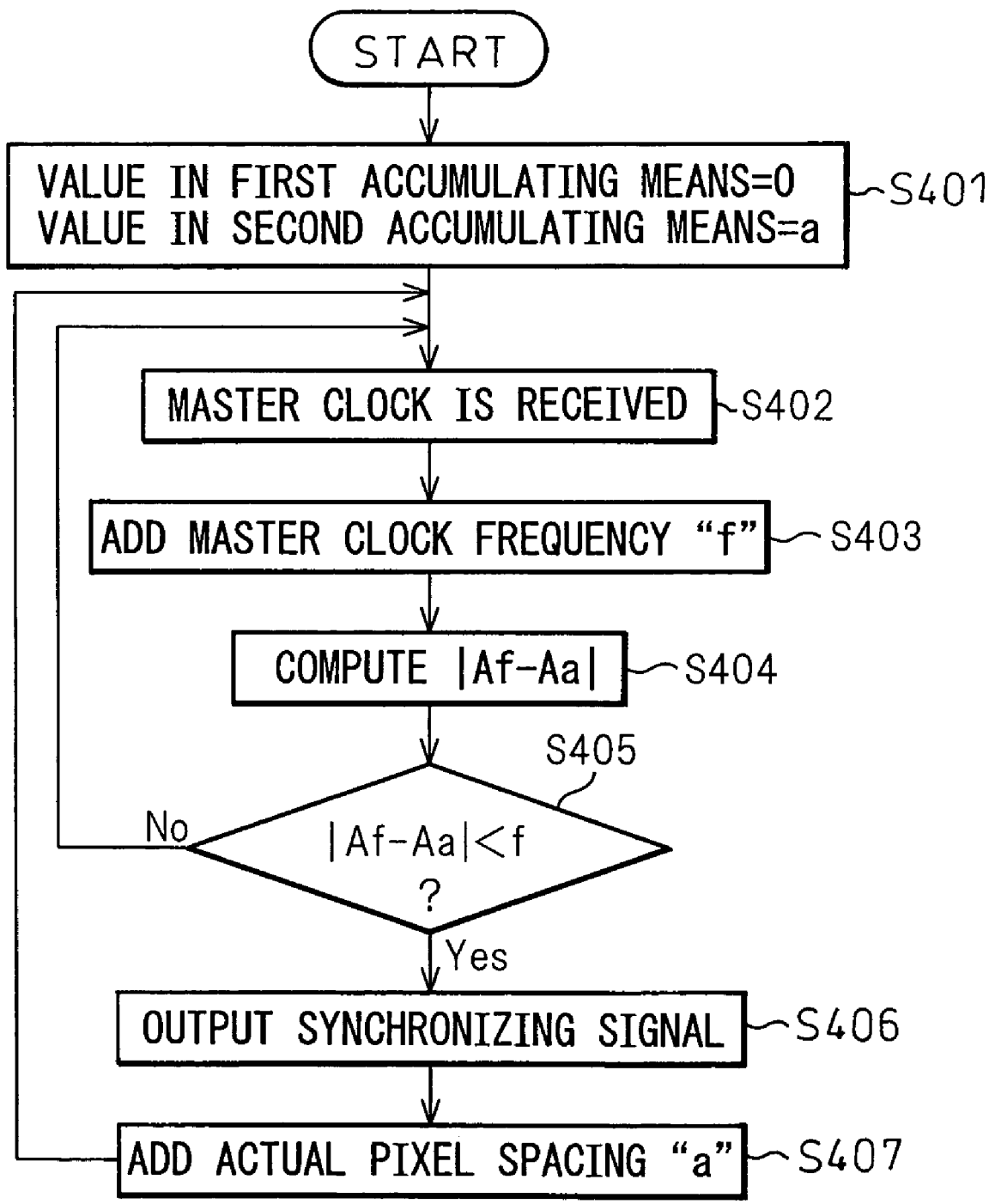
FIG. 13 is a flowchart illustrating a modified example of the synchronizing signal generation algorithm according to the embodiment of the present invention.
Figure 14:
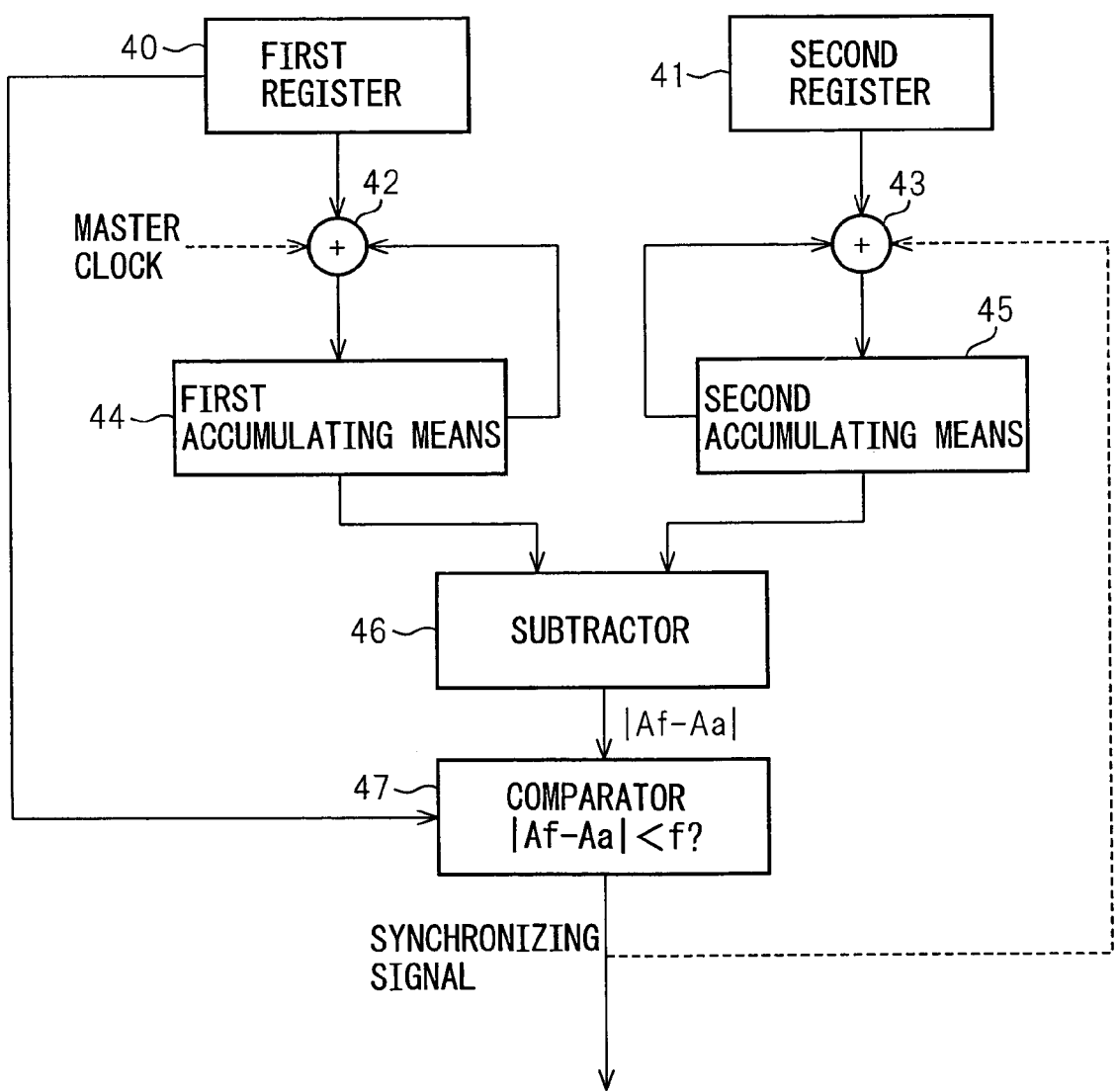
FIG. 14 is a functional block diagram showing a synchronizing means which outputs the synchronizing signal in accordance with the flowchart of FIG. 13.

FIG. 13 is a flowchart illustrating the modified example of the synchronizing signal generation algorithm according to the embodiment of the present invention. FIG. 14 is a functional block diagram showing the synchronizing means which outputs the synchronizing signal in accordance with the flowchart of FIG. 13.

As shown in FIG. 14, the synchronizing means 14 according to the modified example comprises: an adder 42 as the first adding means; an adder 43 as the second adding means; the first accumulating means (accumulator) 44; the second accumulating means (accumulator) 45; a subtractor 46 as the subtracting means; and a comparator 47 as the judging means. The synchronizing means 14 further comprises a first register 40 for storing a numerical value corresponding to the wavelength f of the master clock, and a second register 41 for storing a numerical value corresponding to the actual pixel spacing "a".

In the modified example, first in step S401 of FIG. 13, the accumulated value Af of the wavelength f of the master clock stored in the first accumulating means 44 in FIG. 14 is initialized to 0, and the accumulated value Aa of the actual pixel spacing "a" stored in the second accumulating means 45 is initialized to "a". That is, in the initial condition, Af<<Aa.

When the stage 16 starts moving, the master clock is supplied. When the master clock is received in step S402, the adder 42 in step S403 adds the wavelength f of the master clock stored in the first register 40 to the accumulated value Af of the wavelength of the master clock stored in the first accumulating means 44, and thus the new accumulated value Af is stored in the first accumulating means 44.

Next, in step S404, the subtractor 46 computes the absolute difference |Af−Aa| between the accumulated value Af of the wavelength of the master clock stored in the first accumulating means 44 and the accumulated value Aa of the actual pixel spacing stored in the second accumulating means 45.

Then, in step S405, the judging means 47 judges whether the absolute difference |Af−Aa| computed by the subtractor 46 is smaller than or larger than the wavelength f of the master clock stored in the first register 40. If it is judged by the judging means 47 that the absolute difference |Af−Aa| is larger than the wavelength f of the master clock, the process returns to step S402.

If it is judged by the judging means 47 that the absolute difference |Af−Aa| is smaller than the wavelength f of the master clock, the process proceeds to step S406 to output the synchronizing signal. In step S407, the adder 43 adds the actual pixel spacing "a" stored in the second register 41 to the accumulated value Aa of the actual pixel spacing stored in the second accumulating means 45, and thus the new accumulated value Aa is stored in the second accumulating means 45. Here, the order of the steps S406 and S407 may be interchanged, or these two steps may be carried out simultaneously.

Figure 15:
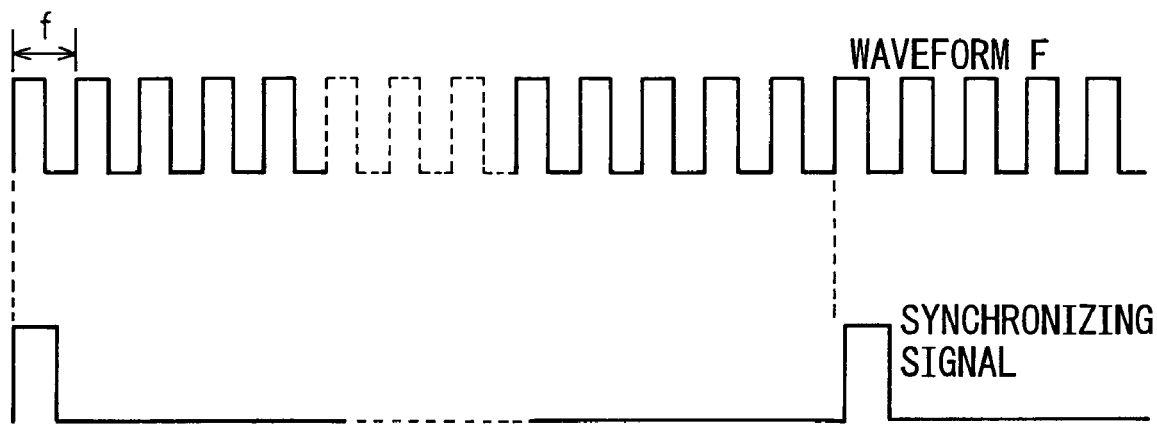
FIG. 15 is a diagram showing one example of a timing chart for the generation of the synchronizing signal based on the flowchart of FIG. 13.
Figure 16:
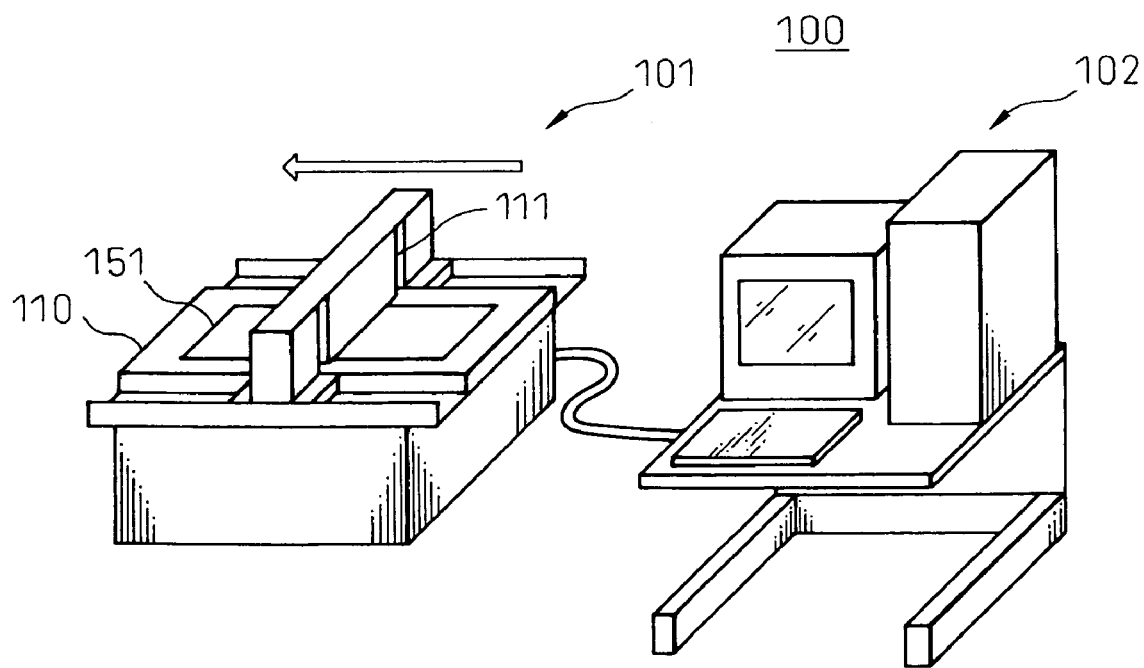
FIG. 16 is a diagram schematically showing a direct drawing system.
Figure 17:
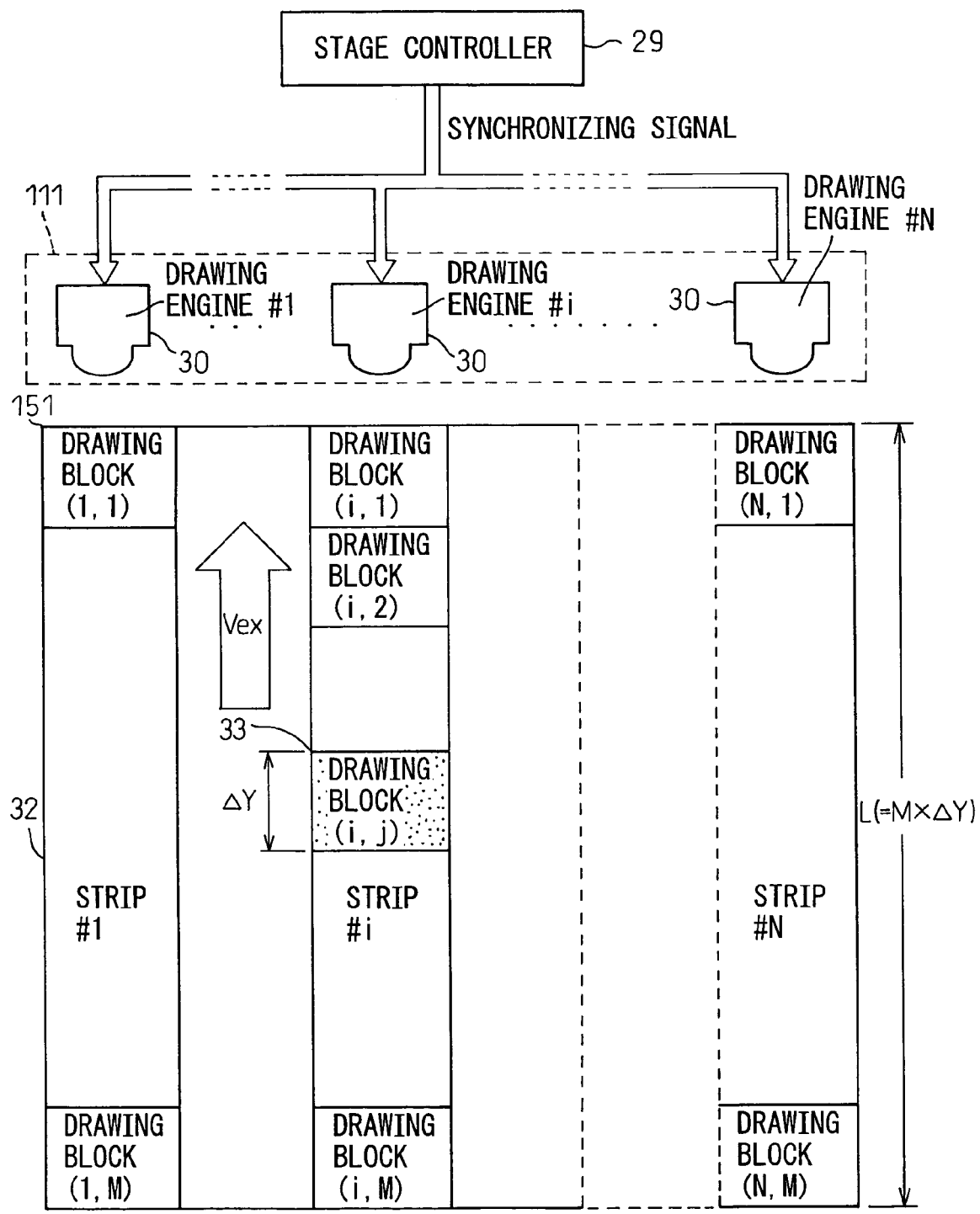
FIG. 17 is a diagram showing the operating principle of the drawing apparatus.
Figure 18:
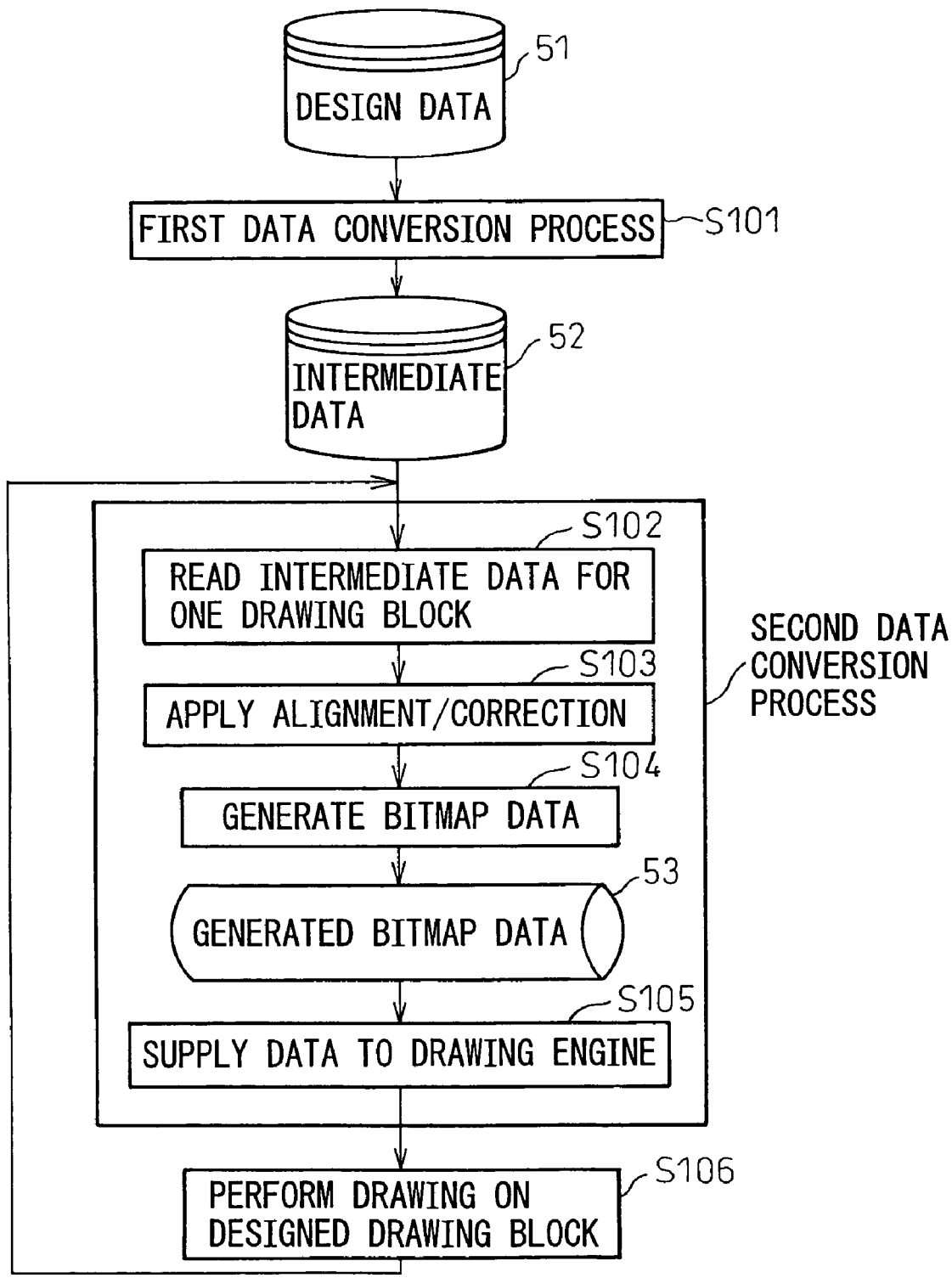
FIG. 18 is a flowchart showing the data processing flow in the drawing apparatus.
Figure 19:
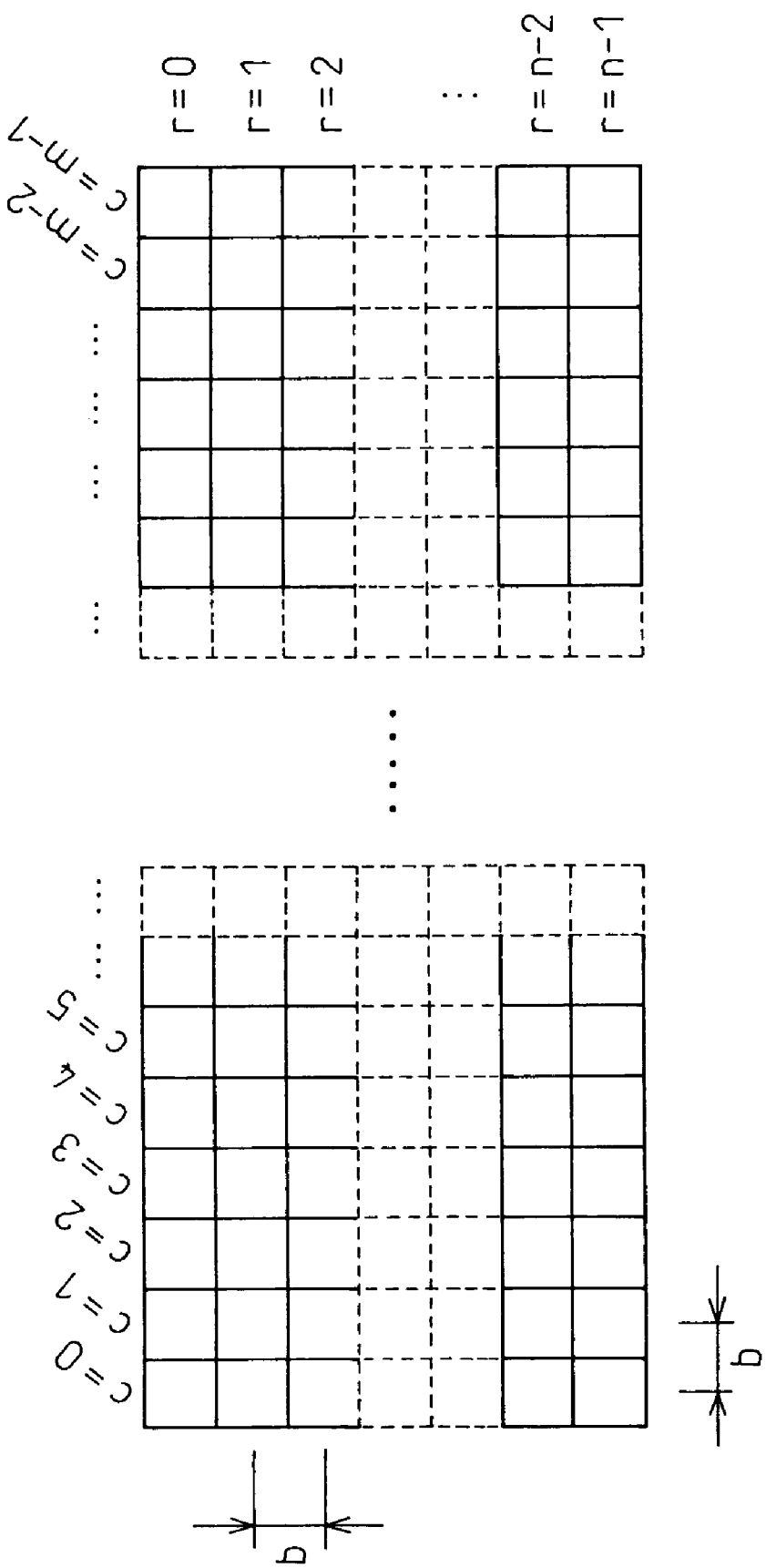
FIG. 19 is a schematic diagram illustrating the concept of the drawing data of bitmap form used in a direct exposure process by the exposure apparatus.
Figure 20:
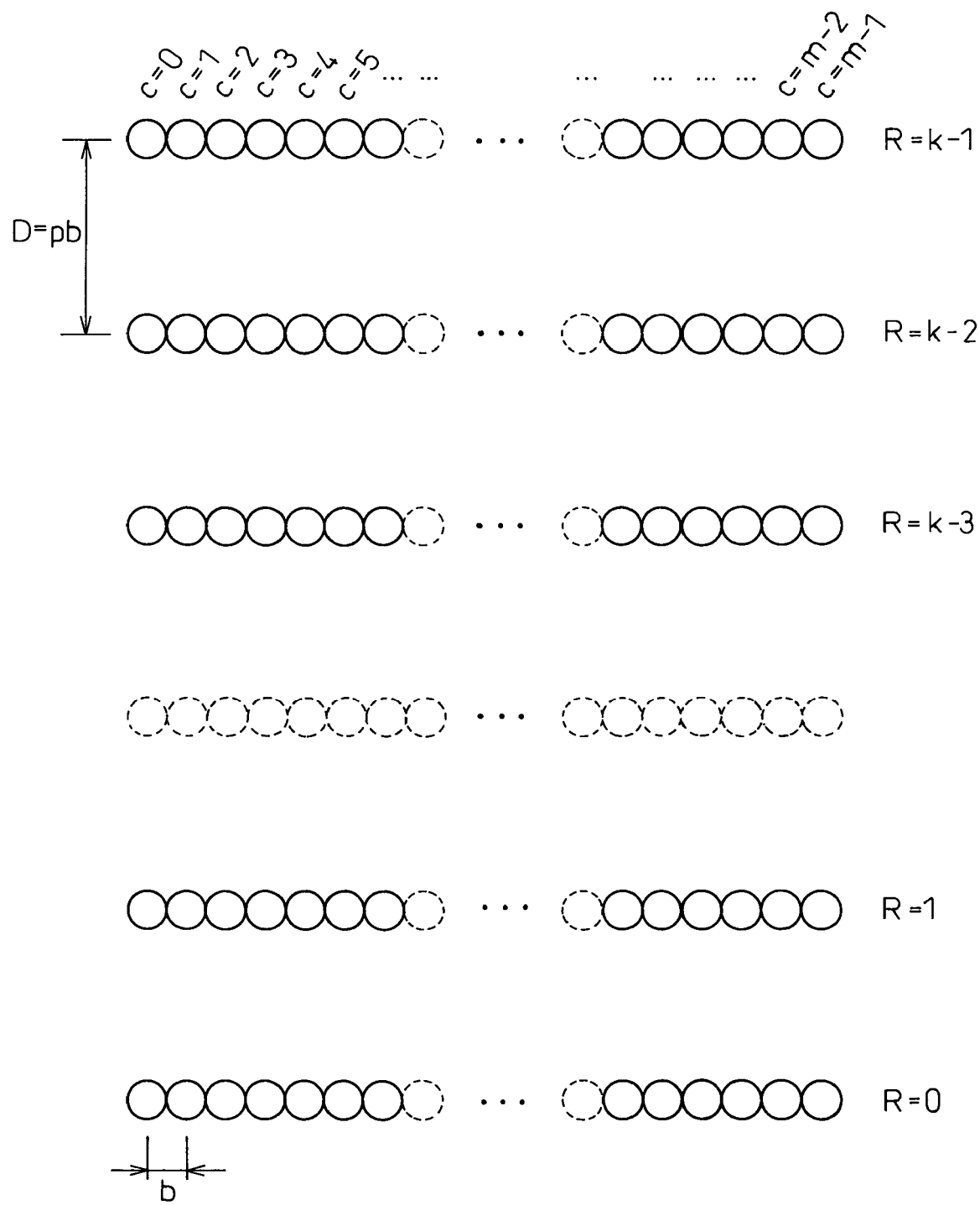
FIG. 20 is a schematic diagram illustrating the arrangement of light sources in one drawing engine that performs direct drawing using the drawing data shown in FIG. 19.
Figure 21:
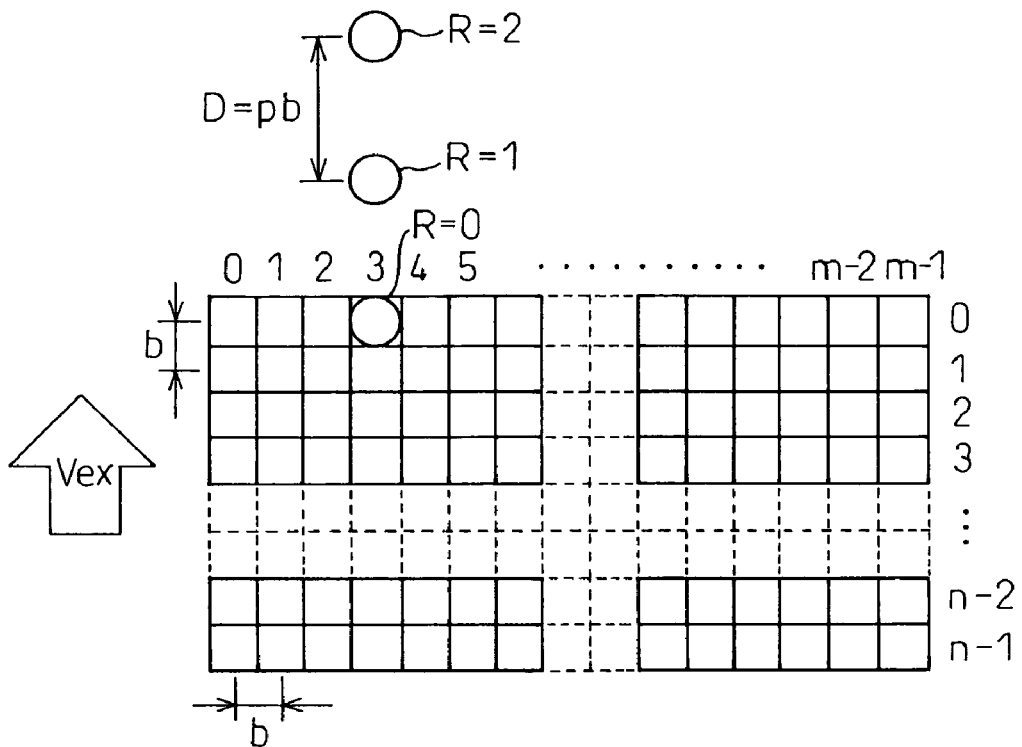
FIGS. 21 and 22 are schematic diagrams (part 1) illustrating the relationship between the bitmap data shown in FIG. 19 and the light source arrangement in the drawing engine shown in FIG. 20.
Figure 22:
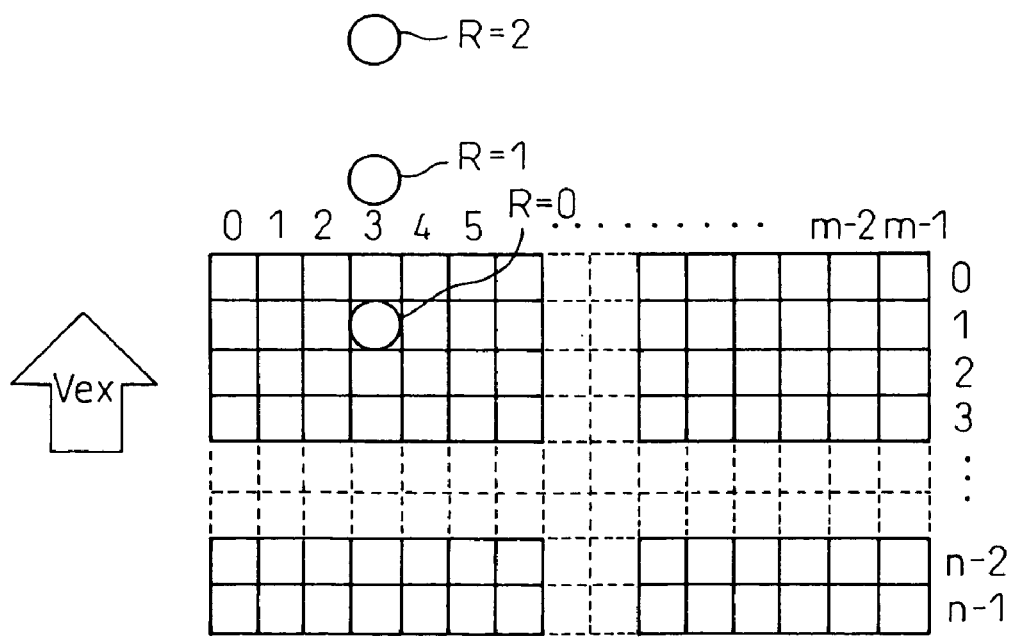
Figure 23:
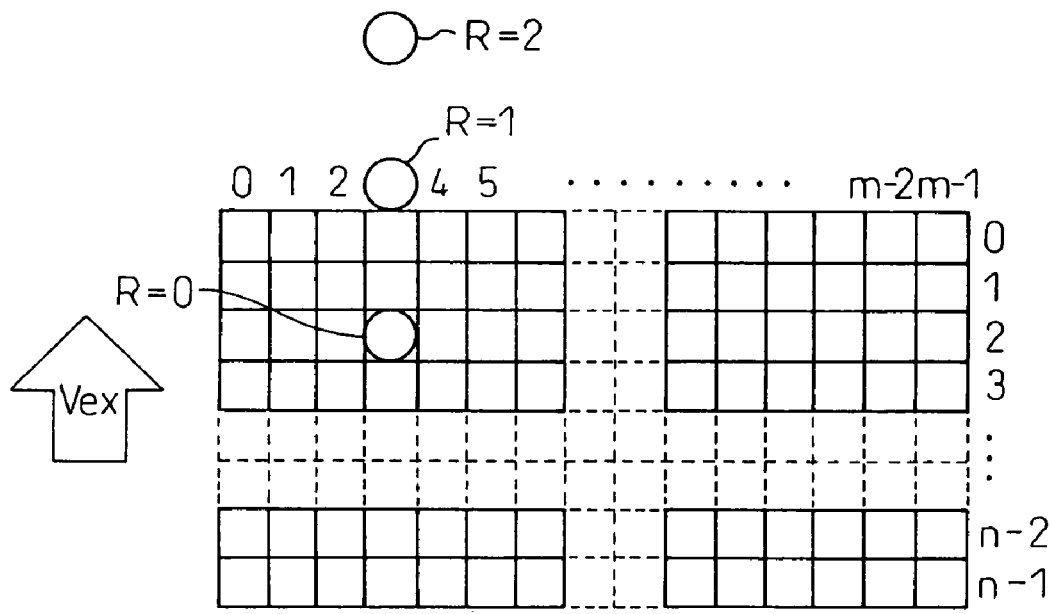
FIGS. 23 and 24 are schematic diagrams (part 2) illustrating the relationship between the bitmap data shown in FIG. 19 and the light source arrangement in the drawing engine shown in FIG. 20.
Figure 24:
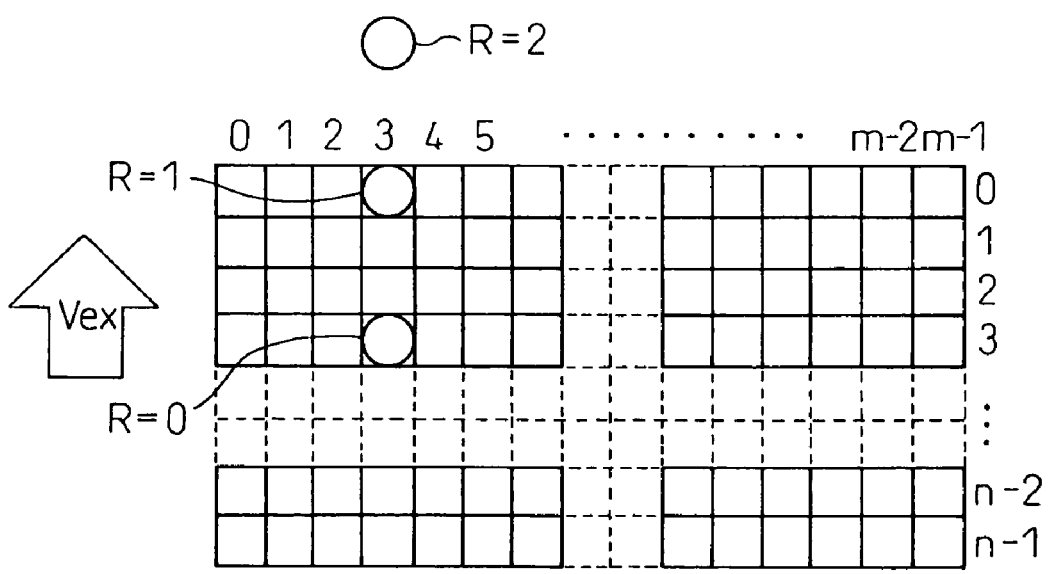

To summarize the above process, the synchronizing means 14 according to the modified example accumulates the wavelength f of the master clock by using the received master clock as a trigger, and outputs the synchronizing signal only when the accumulated value Af of the wavelength of the master clock becomes the closest to the accumulated value Aa of the actual pixel spacing. Then, at the same time that the synchronizing signal is output, the actual pixel spacing "a" is added to the accumulated value Aa of the actual pixel spacing, and the result is stored as the new accumulated value Aa of the actual pixel spacing. Thereafter, the above process is repeated. That is, when the accumulated value Af of the wavelength of the master clock, which is accumulated as the master clock is received, becomes the closest to the new accumulated value Aa of the actual pixel spacing, the synchronizing signal is output and, at the same time, the actual pixel spacing "a" is added to the accumulated value Aa of the actual pixel spacing. More specifically, there is a difference in timing between the above additions; that is, the wavelength f of the master clock is added to the accumulated value Af each time the master clock is received, while the actual pixel spacing "a" is added to the accumulated value Aa when the accumulated value Af of the wavelength of the master clock becomes the closest to the accumulated value Aa of the actual pixel spacing. FIG. 15 is a diagram showing one example of a timing chart for the synchronizing signal generation based on the flowchart of FIG. 13. The timing chart here illustrates how the synchronizing signal is generated based on the master clock having the wavelength f and the waveform F. When the stage 16 moves and reaches the end of the exposure target substrate during the exposure process, the supply of the master clock is stopped, and the accumulated value Af of the wavelength of the master clock stored in the first accumulating means 44 and the accumulated value Aa of the actual pixel spacing stored in the second accumulating means 45 are both reset.

In this way, in the modified example described above, the synchronizing signal generation requirements are converted into numerical values and are implemented in conventional digital circuits (registers, adders, accumulators, subtractor, and comparator), and the generation of the array table or the count table or the calculation of the least common multiple, as required in the earlier described embodiment, is not needed here. The values that the registers, adders, accumulators, subtractor, and comparator handle need not necessarily be limited to real numbers (fixed-point numbers), but may be floating-point numbers.

One specific numerical example of the above modified example will be described below. That is, in the example in which the registers, adders, accumulators, subtractor, and comparator handle only integers, the value of the wavelength f of the master clock and the value of the actual pixel spacing "a" are converted into integers by taking the figures to the right of the decimal point up the necessary number of places until the necessary accuracy is obtained, and the thus converted values are stored in the first register 40 and the second register 41, respectively. For example, when f=19.776252201 nm, and "a"=490.000000000 nm, the respective values are converted into integers each having a very large number of digits, that is, fx=19776252201 and ax=490000000000. If it is assumed here that the stage on which the exposure target substrate is mounted moves over the distance L=1 m, then since L/a($\cong 2.04 \times 10^6$) synchronizing signals are generated, the accumulated value Aa of the actual pixel spacing stored in the second accumulating means 45 becomes as large as about $1 \times 10^{18}$. This requires that the registers, adders, accumulators, subtractor, and comparator have about 64-bit data handling capabilities but, even for the digital circuits of this scale, the necessary functions can be implemented sufficiently and easily by using FPGA devices or the like.

Further, the wavelength f of the master clock stored in the first register 40 of FIG. 14 can be easily altered from the outside; for example, a reference signal source other than the laser interferometer can be used to provide the master clock.

Likewise, the value of the actual pixel spacing "a" stored in the second register 41 can also be easily altered from the outside, and the actual pixel spacing "a" can be changed as desired without changing the circuit configuration. Furthermore, when the values of a plurality of different actual pixel spacings "a" are needed, the second register 41 and the second accumulating means 45 should be provided for each actual pixel spacing "a", while leaving the first register 40 and the first accumulating means 44 intact.

The correcting means 11, supplying means 12, clock generating means 13, and synchronizing means 14 in the exposure apparatus 1 described above can each be implemented in a combination of hardware and a software program executable by a processing unit such as a computer. Here, a program for causing the computer to execute each process is stored on a recording medium, and is loaded as needed, into the work memory within the computer, for execution.

The exposure apparatus has been described in the above embodiment, but it will be appreciated that exactly the same principle can also be applied to other drawing apparatuses in which a plurality of drawing heads are arranged at predetermined spacing and the drawing operation is performed with the drawing target moving relative to the drawing heads. An inkjet drawing apparatus and a printing apparatus such as a laser printer are examples of such drawing apparatuses.

Of these apparatuses, an inkjet drawing apparatus that uses inkjet technology is an apparatus that comprises a plurality of inkjet nozzles arranged at prescribed design spacing within an inkjet head, and that performs drawing with the drawing target moving relative to the inkjet head; in recent years, this type of apparatus has been attracting attention as a promising means for directly drawing (patterning) a drawing pattern on a substrate.

Inkjet technology is a technology that ejects liquid droplets through microscopic nozzles. Generally, the inkjet technology is used for printers, but when applying the inkjet technology to inkjet patterning, the liquid droplets to be ejected from the nozzles should be formed from a liquid containing fine metal particles or from a metal oxide material. The inkjet technology can be classified into two main types: one is the piezoelectric type that utilizes a piezoelectric element which, when a voltage is applied, is caused to deform, causing a sudden increase in the liquid pressure in the ink chamber and thereby forcing a liquid droplet through the nozzle, and the other is the thermal type that forms a bubble in the liquid by a heater mounted on the head and thereby pushes out a liquid droplet. Either type can be used in the present invention. When applying the present invention to the inkjet drawing apparatus, the exposure head, i.e., the light source, in the above-described embodiment of the present invention should be replaced by an inkjet head.

The present invention can be applied to a drawing apparatus in which the drawing data necessary for the direct drawing to the drawing block on the drawing target surface that the drawing head moving in relative fashion over the drawing target surface can draw at a time is sequentially generated based on design data and sequentially supplied to the drawing engine. The present invention can be applied to any drawing apparatus whether it be a maskless exposure apparatus or an inkjet drawing apparatus.

According to the patterning method based on direct drawing, the design, inspection, and formation of high-precision wiring can be accomplished easily and at high speed and, also, the margin necessary for pattern alignment can be reduced, which serves to increase the wiring density. Accordingly, the invention can address a need for superfine wiring expected in the future. A further advantage is that, by processing the design data as needed and accumulating the correction information, the present invention can perform the correction and the routing dynamically and can thus cope with design changes flexibly.

According to the drawing apparatus of the present invention, differences in resolution performance resulting from manufacturing variations among the drawing engines used in the drawing apparatus can be corrected for, and a high resolution performance can be achieved, without imposing extra burden on other various functions within the drawing apparatus, and without involving a substantial increase in the amount of computation; therefore, the drawing apparatus of the present invention is best suited to form complicated wiring patterns that require particularly high precision.

What is claimed is:

1. A drawing apparatus for forming a desired drawing pattern by drawing said pattern directly on a drawing target surface of a drawing target substrate using a drawing engine equipped with a plurality of drawing devices arranged along a direction of relative movement of said drawing target surface, said drawing engine being designed so that design spacing of said arranged drawing devices is equal to a product of a unit pixel spacing in drawing data and an integer, said drawing apparatus comprising:

correcting means for generating corrected drawing data by correcting said drawing data based on a difference between said design spacing and an actual spacing at which said plurality of drawing devices are arranged; and supplying means for supplying said drawing engine with just said corrected drawing data necessary for direct drawing to a drawing block that said drawing engine can draw at a time on said drawing target surface, each time said drawing target substrate moves in relative fashion by a distance corresponding to an actual pixel spacing that is obtained by dividing said actual spacing of said drawing devices by said integer, and wherein said drawing pattern is formed based on said corrected drawing data.

2. A drawing apparatus according to claim 1, wherein said correcting means corrects said drawing data by taking the ratio of said design spacing to said actual spacing of said drawing devices as representing an image expansion/shrinkage rate in said drawing data in the direction of said relative movement, and thereby generates said corrected drawing data.

3. A drawing apparatus according to claim 1, further comprising:

clock generating means for generating a master clock which is periodically output as said drawing target surface moves in relative fashion by a unit distance; and synchronizing means for generating, based on said master clock, a synchronizing signal that provides a timing reference for said supplying means to supply said corrected drawing data to said drawing engine.

4. A drawing apparatus according to claim 3, wherein said synchronizing means comprises:

first computing means for computing the least common multiple of said actual pixel spacing and the wavelength of said periodically output master clock both expressed in the same unit;

second computing means for computing an array element s[t] for which an absolute value |s[t]×f−t×a| is the smallest, for each integer t contained in an interval from zero to a value obtained by dividing said least common multiple by said actual pixel spacing, where "a" denotes said actual pixel spacing and "f" denotes the wavelength of said master clock; and output means for outputting said synchronizing signal when said master clock is counted up to the value of said array element s[t] computed by said second computing means.

5. A drawing apparatus according to claim 4, wherein said drawing apparatus comprises a plurality of said drawing engines, and said synchronizing means generates said synchronizing signal for each of said drawing engines.

6. A drawing apparatus according to claim 3, wherein said synchronizing means comprises:

first accumulating means for storing an accumulated value of the wavelength of said master clock;

first adding means for adding, each time said master clock is received, the wavelength of said master clock to the accumulated value of the wavelength of said master clock stored in said first accumulating means;

second accumulating means for storing an accumulated value of said actual pixel spacing;

subtracting means for computing an absolute difference between the accumulated value of the wavelength of said master clock stored in said first accumulating means and the accumulated value of said actual pixel spacing stored in said second accumulating means;

judging means for judging whether said absolute difference is smaller than or larger than the wavelength of said master clock;

output means for outputting said synchronizing signal when it is judged by said judging means that said absolute difference is smaller than the wavelength of the master clock; and second adding means for adding said actual pixel spacing to the accumulated value of said actual pixel spacing stored in said second accumulating means, when it is judged by said judging means that said absolute difference is smaller than the wavelength of said master clock.

7. A drawing apparatus according to claim 6, wherein said drawing apparatus comprises a plurality of said drawing engines, and said synchronizing means generates said synchronizing signal for each of said drawing engines.

8. A drawing apparatus according to claim 1, wherein said drawing apparatus comprises a plurality of said drawing engines, and wherein said correcting means generates said corrected drawing data for each of said drawing engines by using said actual spacing of said drawing devices measured on each of said drawing engines, and said supplying means supplies said corrected drawing data, generated by said correcting means for each of said drawing engines, to each corresponding one of said drawing engines.

9. A drawing apparatus according to claim 3, wherein said drawing apparatus comprises a plurality of said drawing engines, and said synchronizing means generates said synchronizing signal for each of said drawing engines.

10. A drawing method for forming a desired drawing pattern by drawing said pattern directly on a drawing target surface of a drawing target substrate using a drawing engine equipped with a plurality of drawing devices arranged along a direction of relative movement of said drawing target surface, said drawing engine being designed so that the design spacing of said arranged drawing devices is equal to a product of a unit pixel spacing in drawing data and an integer, said drawing method comprising:

a correcting step for generating corrected drawing data by correcting said drawing data based on a difference between said design spacing and an actual spacing at which said plurality of drawing devices are arranged; and a supplying step for supplying said drawing engine with just said corrected drawing data necessary for direct drawing to a drawing block that said drawing engine can draw at a time on said drawing target surface, each time said drawing target substrate moves in relative fashion by a distance corresponding to an actual pixel spacing that is obtained by dividing said actual spacing of said drawing devices by said integer, and wherein said drawing pattern is formed based on said corrected drawing data.

11. A drawing method according to claim 10, wherein said correcting step corrects said drawing data by taking the ratio of said design spacing to said actual spacing of said drawing devices as representing an image expansion/shrinkage rate in said drawing data in the direction of said relative movement, and thereby generates said corrected drawing data.

* * * * *